(12) United States Patent
Edo et al.

(10) Patent No.: US 7,994,890 B2
(45) Date of Patent: Aug. 9, 2011

(54) INSULATING TRANSFORMER AND POWER CONVERSION DEVICE

(75) Inventors: Masaharu Edo, Tokorozawa (JP); Katsunori Ueno, Matsumoto (JP); Hiroyuki Yoshimura, Yokohama (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 334 days.

(21) Appl. No.: 12/219,713

(22) Filed: Jul. 28, 2008

(65) Prior Publication Data
US 2009/0052214 A1    Feb. 26, 2009

(30) Foreign Application Priority Data

Aug. 13, 2007   (JP) ................................ 2007-210837

(51) Int. Cl.
*H01F 5/00*    (2006.01)
(52) U.S. Cl. ......... 336/200; 336/223; 336/232; 257/531
(58) Field of Classification Search .................. 336/200, 336/223, 232; 257/531
See application file for complete search history.

(56) References Cited

U.S. PATENT DOCUMENTS

| | | | | |
|---|---|---|---|---|
| 6,636,139 B2 * | 10/2003 | Tsai et al. | ...................... | 336/200 |
| 6,806,028 B2 * | 10/2004 | Kubota | ...................... | 430/270.1 |
| 6,927,662 B2 * | 8/2005 | Kahlmann et al. | ............ | 336/200 |
| 7,164,339 B2 * | 1/2007 | Huang | ........................... | 336/200 |
| 7,315,212 B2 * | 1/2008 | Floyd et al. | ................... | 330/305 |
| 7,422,941 B2 * | 9/2008 | Lin | ............... | 438/238 |
| 7,429,779 B2 * | 9/2008 | Itoi et al. | ....................... | 257/528 |
| 7,470,927 B2 * | 12/2008 | Lee et al. | ....................... | 174/524 |
| 7,474,190 B2 * | 1/2009 | Strzalkowski et al. | ........ | 336/200 |
| 7,489,220 B2 * | 2/2009 | Baumgartner et al. | ........ | 336/200 |
| 7,924,131 B2 * | 4/2011 | Walls | ............................ | 336/200 |
| 2005/0230837 A1 | 10/2005 | Taghizaden-Kaschani | | |

FOREIGN PATENT DOCUMENTS

| | | |
|---|---|---|
| JP | 2005-005685 | 1/2005 |
| JP | 2005-310959 | 11/2005 |

* cited by examiner

*Primary Examiner* — Anh Mai
*Assistant Examiner* — Joselito Baisa
(74) *Attorney, Agent, or Firm* — Manabu Kanesaka

(57) ABSTRACT

An insulating transformer includes a semiconductor substrate, an insulating substrate, a primary winding provided on one of the semiconductor substrate and the insulating substrate, a secondary winding provided on other of the semiconductor substrate and the insulating substrate, and an insulating spacer layer provided in between the semiconductor substrate and the insulating substrate for insulating and separating the primary winding and the secondary winding. The primary winding and the secondary winding are disposed to face each other. The insulating spacer layer maintains a constant interval between the semiconductor substrate and the insulating substrate.

12 Claims, 13 Drawing Sheets

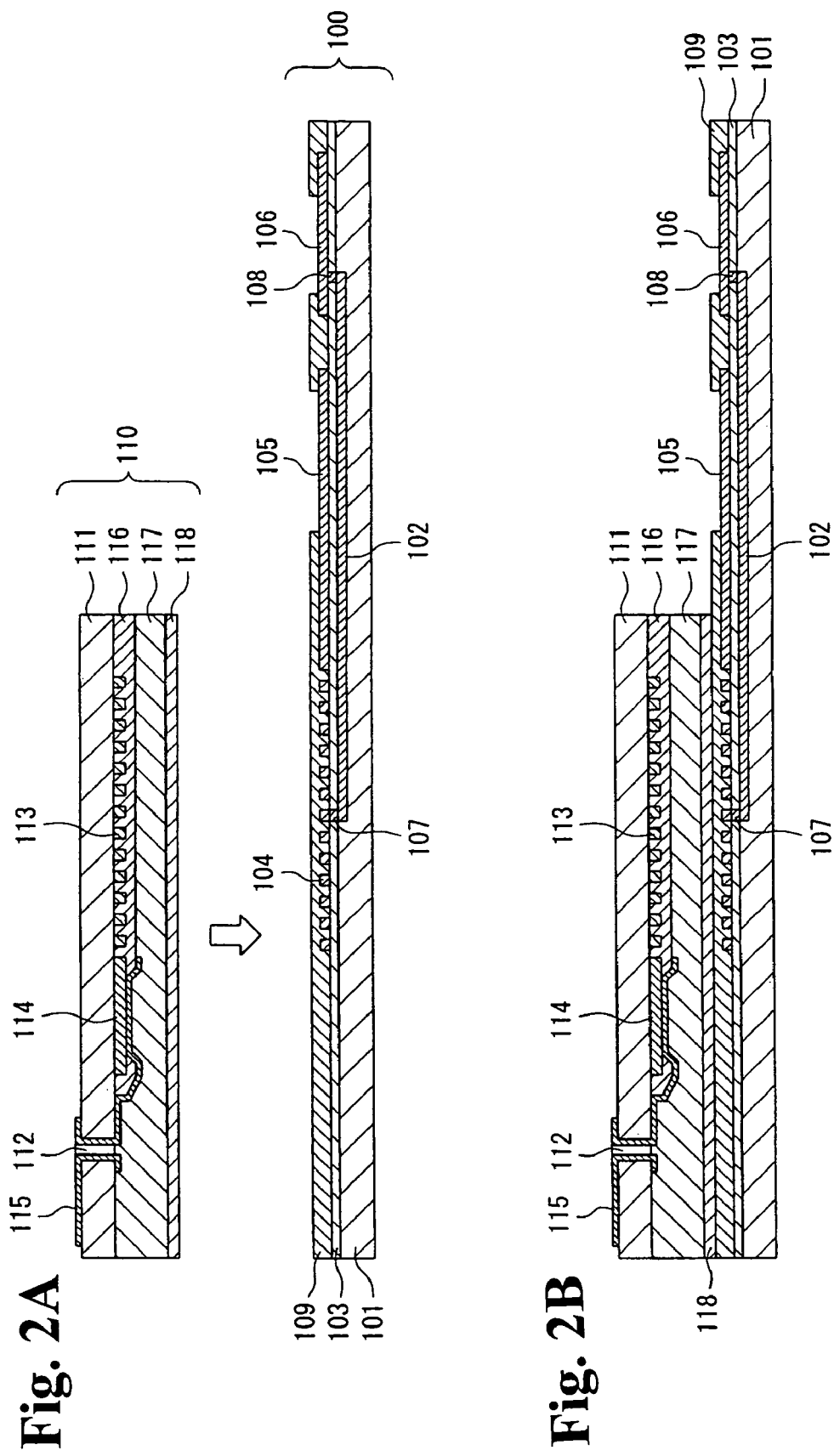

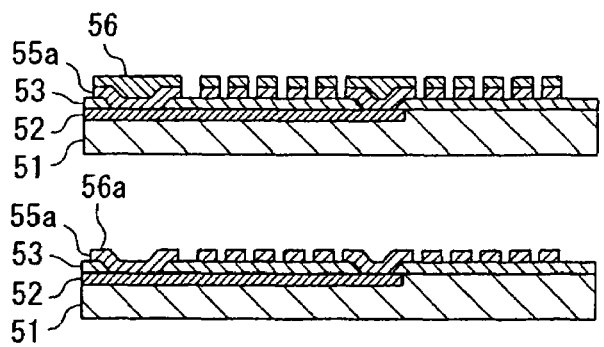
Fig. 15H Prior Art
Fig. 15I Prior Art
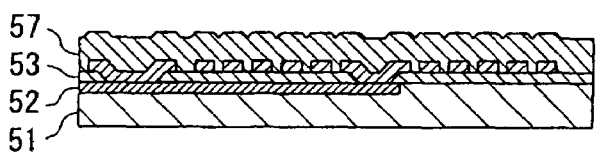
Fig. 15J Prior Art
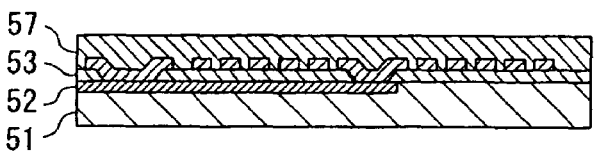
Fig. 15K Prior Art
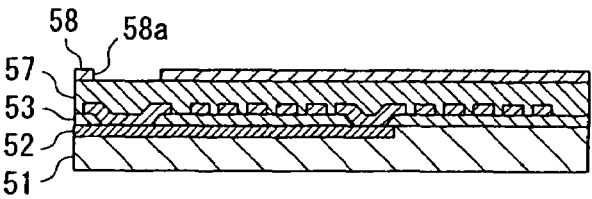
Fig. 15L Prior Art

INSULATING TRANSFORMER AND POWER CONVERSION DEVICE

BACKGROUND OF THE INVENTION AND RELATED ART STATEMENT

The present invention relates to an insulating transformer and a power conversion device, and more specifically to an insulating transformer suitable for an application of a method employing glass substrate for the insulation of the primary-side windings and the secondary-side windings of the insulating transformer.

In recent years, in order to provide automotive equipments with higher efficiencies and reduced power consumptions, buck-boost converters and inverters have been provided in driving systems for electric motors which generate driving force.

FIG. 6 is a block diagram roughly showing the configuration of an automotive driving system using a conventional buck-boost converter.

In FIG. 6, the automotive driving system comprises a power supply 1101, which supplies power to the buck-boost converter 1102; the buck-boost converter 1102, which raises and lowers voltages; an inverter 1103, which converts a voltage output from the buck-boost converter 1102 into a three-phase voltage; and a motor 1104, which drives the automobile. The power supply 1101 can comprise a feed voltage provided from an overhead line, or batteries connected in series.

During an operation of the vehicle, the buck-boost converter 1102 raises the voltage of the power supply 1101 (for example, 280 V) to a voltage appropriate to drive the motor 1104 (for example, 750 V), and supplies the voltage to the inverter 1103. By executing on/off control of a switching element, the voltage raised by the buck-boost converter 1102 is converted into a three-phase voltage, current is passed to each of the phases of the motor 1104, and the vehicle speed can be changed by controlling the switching frequency.

On the other hand, during an operation of brakes, the inverter 1103 executes on/off control of the switching element in synchronization with the voltage occurring in the each phase of the motor 1104 to perform rectification, and after conversion into a DC voltage, supplies the result to the buck-boost converter 1102. The buck-boost converter 1102 can, then, lower the voltage generated from the motor 1104 (for example, 750 V) to the voltage of the power supply 1101 (for example, 280 V), to perform power regeneration.

FIG. 7 is a block diagram briefly showing the configuration of the buck-boost converter of FIG. 6.

In FIG. 7, the buck-boost converter 1102 is provided with a reactor L, which accumulates energy; a capacitor C, which accumulates charge; switching elements SW1 and SW2, which pass and block current flowing into the inverter 1103; and control circuits 1111 and 1112, which respectively generate control signals to instruct the switching elements SW1 and SW2 to conduct or not to conduct.

Also, the switching elements SW1 and SW2 are connected in series, and the connection point of the switching elements SW1 and SW2 is connected to the power supply 1101 via the reactor L. Here, the switching element SW1 is provided with an IGBT (Insulated Gate Bipolar Transistor) 1105, which performs switching operations according to control signals from the control circuit 1111; a flywheel diode D1, which carries current in the direction opposite to the direction of current flowing in the IGBT 1105, is connected in parallel with the IGBT 1105.

Further, the switching element SW2 is provided with an IGBT 1106 which performs switching operations according to control signals from the control circuit 1112; a flywheel diode D2, which carries current in the direction opposite to the direction of current flowing in the IGBT 1106, is connected in parallel with the IGBT 1106. And, the collector of the IGBT 1106 is connected to both of the capacitor C and the inverter 1103.

FIG. 8 shows the waveform of current flowing in the reactor L of FIG. 7 during a step-up operation.

In FIG. 8, during the step-up operation, when the IGBT 1105 of the switching element SW1 turns on (is conducting), current I flows in the reactor L via the IGBT 1105, and energy $LI^2/2$ is stored in the reactor L.

Next, when the IGBT 1105 of the switching element SW1 turns off (is non-conducting), current flows in the flywheel diode D2 of the switching element SW2, and the energy stored in the reactor L is sent to the capacitor C.

On the other hand, in a step-down operation, when the IGBT 1106 of the switching element SW2 turns on (conducting state), current I flows to the reactor L via the IGBT 1106, and energy $LI^2/2$ is stored in the reactor L.

Next, when the IGBT 1106 of the switching element SW2 turns off (non-conducting state), current flows to the flywheel diode D1 of the switching element SW1, and the energy stored in the reactor L is regenerated to the power supply 1101.

Here, by changing the on-time (ON Duty) of the switching elements, the step-up and step-down voltages can be adjusted, and the approximate voltage value can be determined using equation (1) below.

$$V_L/V_H = \text{ON Duty}(\%) \tag{1}$$

Here, $V_L$ is the power supply voltage, $V_H$ is the voltage after step-up or step-down, and the ON Duty is the conducting interval of the switching elements SW1 and SW2 as a fraction of the switching period.

In actuality, there are fluctuations in the load, fluctuations in the power supply voltage $V_L$, and similar, and so the voltage $V_H$ after step-up or step-down is monitored. The on-time (ON Duty) of the switching elements SW1 and SW2 is controlled such that the voltage $V_H$ after step-up/step-down is the target value.

Also, the sides of the control circuits 1111, 1112 connected to the vehicle body are at low voltage, and the arm sides connected to the switching elements SW1 and SW2 are at high voltage. Hence, in order that the operator is not exposed to danger even when accidents such as malfunctions of the switching elements SW1, SW2 occur, a photocoupler is used on the arm sides to exchange signals while electrically insulating the control circuits 1111 and 1112.

FIG. 9 is a block diagram briefly showing the configuration of an intelligent power module for a conventional buck-boost converter.

In FIG. 9, the buck-boost converter intelligent power module is provided with switching elements SWU and SWD which pass and block current flowing to the load, and a control circuit 1 which generates control signals respectively indicating conduction and non-conduction of the switching elements SWU and SWD. Here, the control circuit 1 can comprise a CPU 4 or logic IC, or a system LSI provided with a logic IC and CPU, or similar.

The switching elements SWU and SWD are connected in series so as to operate the upper arm 2 and the lower arm 3 respectively. An IGBT 6 which performs a switching operation according to gate signals SU4 is provided to the switching element SWU, and a flywheel diode DU1, which passes current in the direction opposite to the current flowing in the IGBT 6, is connected in parallel with the IGBT 6. On the chip on which the IGBT 6 is formed are also provided a temperature sensor used for measurement of VF changes in the diode DU2 arising from chip temperature changes, and a current sensor which divides the emitter current of the IGBT 6 by means of resistances RU1 and RU2 and detects the main circuit current.

Further, the switching element SWD is provided with an IGBT 5 which performs switching operations according to a gate signal SD4; a flywheel diode DD1, which passes current in the direction opposite to the direction of current flowing in the IGBT 5, is connected in parallel with the IGBT 5. Also, on the chip on which the IGBT 5 is formed are also provided a temperature sensor used for measurement of VF changes in the diode DD2 arising from chip temperature changes, and a current sensor which divides the emitter current of the IGBT 5 by means of resistances RD1 and RD2 and detects the main circuit current.

On the side of the upper arm 2 are provided a gate driver IC 8 with protection functions, which generates a gate signal SU4 to drive the control terminal of the IGBT 6 while monitoring an overheating detection signal SU6 from the temperature sensor and an overcurrent detection signal SU5 from the current sensor, as well as an analog-PWM converter CU which generates PWM signals corresponding to the temperature of the IGBT 6.

Also, on the side of the lower arm 3 are provided a gate driver IC 7 with protection functions, which generates a gate signal SD4 to drive the control terminal of the IGBT 5 while monitoring an overheating detection signal SD6 from the temperature sensor and an overcurrent detection signal SD5 from the current sensor, as well as an analog-PWM converter CD which generates PWM signals corresponding to the temperature of the IGBT 5.

Between the control circuit 1 connected to the vehicle body, and the high-voltage upper arm 2 and lower arm 3, are inserted photocouplers FU1 to FU3 and FD1 to FD3, respectively. In the control circuit 1, signals are exchanged using the photocouplers FU1 to FU3 and FD1 to FD3 while maintaining electrical insulation with the upper arm 2 and lower arm 3.

That is, on the side of the upper arm 2, SU1(PWM signals for gate driving) output from the CPU 4 are input to the gate driver IC 8 with protection functions via the photocoupler FU1. And, alarm signals SU2 output from the gate driver IC 8 with protection functions are input to the CPU 4 via the photocoupler FU2. Also, IGBT chip temperature PWM signals SU3 output from the analog-PWM converter CU are input to the CPU 4 via the photocoupler FU3.

On the other hand, on the side of the lower arm 3, PWM signals SD1 for gate driving output from the CPU 4 are input to the gate driver IC 7 with protection functions via the photocoupler FD1. And, alarm signals SD2 output from the gate driver IC 7 with protection functions are input to the CPU 4 via the photocoupler FD2. Also, IGBT chip temperature PWM signals SD3 output from the analog-PWM converter CD are input to the CPU 4 via the photocoupler FD3.

FIG. 10 is a block diagram briefly showing the configuration of a photocoupler peripheral circuit.

In FIG. 10, the photocoupler 2008 is provided with an infrared light-emitting diode 2003, which emits infrared light as a result of forward current If, a light-receiving diode 2004, which receives emitted infrared light, and a bipolar transistor 2005, which performs current amplification with the photocurrent generated by the light-receiving diode 2004 as the base current. The cathode of the infrared light-emitting diode 2003 is connected via a resistance 2002 to a field effect transistor 2001, and the collector of the bipolar transistor 2005 is connected via a resistance 2006 to a power supply voltage Vcc2, while output signals Vout output via the collector of the bipolar transistor 2005 are input to the IGBT driver IC 2007.

When a gate signal SP is input to the field effect transistor 2001, a forward current If flows in the infrared light-emitting diode 2003, and infrared light is emitted. Then, the infrared light emitted from the infrared light-emitting diode 2003 is received by the light-receiving diode 2004, and a photocurrent corresponding to this infrared light flows in the base of the bipolar transistor 2005. When this photocurrent flows in the base of the bipolar transistor 2005, a collector current Ic flows in the bipolar transistor 2005, and the collector current Ic flows in the resistance 2006 one end of which is connected to the power supply voltage Vcc2, and the change in the voltage at the other end of the resistance 2006 is input to the IGBT driver IC 2007 as an output signal Vout.

Here, the input/output characteristics of the isolated photocoupler 2008 can be defined in terms of the current transfer ratio (CTR), that is, Ic/If. When designing a circuit using a photocoupler 2008, consideration must be paid to: the temperature characteristic of the current gain hfe of the bipolar transistor 2005; degradation of the emission efficiency lifetime of the infrared light-emitting diode 2003; and variation in the CTR, and similar.

FIG. 11 shows the temperature characteristic of the current transfer ratio of a photocoupler.

In FIG. 11, the lower the temperature, the lower is the current transfer ratio of the photocoupler 2008. The cause of this result is the temperature characteristic of the current gain hfe of the bipolar transistor 2005.

FIG. 12 shows the aging degradation of the current transfer ratio of a photocoupler.

In FIG. 12, the CTR of the photocoupler 2008 declines depending on the forward current of the light-emitting diode 2003, the ambient temperature, and cumulative usage time; in particular, when the continuous usage time of the photocoupler 2008 exceeds 1000 hours, the decline of the CTR appears prominently.

FIG. 13 shows variation in the current transfer ratio of a photocoupler.

In FIG. 13, the variation in the photocoupler current transfer ratio is large; possible reasons include variations in the light emission efficiency of the light-emitting diode 2003 and in the current gain hfe of the bipolar transistor 2005.

And, when using a photocoupler as the insulated transmission means of an intelligent power module for the buck-boost converter of FIG. 9, circuit design must be performed while taking the above points into consideration, but it is difficult to satisfy demands for continuous operation of ten years or longer in high-temperature environments, such as those of vehicles or industrial equipment.

On the other hand, there is also the method by using insulating transformers, rather than photocouplers, as the insulation means of transmission signals. As such insulating transformers, greatly miniaturized microtransformers utilizing MEMS (Micro-Electro-Mechanical Systems) technology have been commercialized by a number of companies.

In FIG. 14A, a summary cross-sectional view of the configuration of a conventional insulating transformer is shown, and FIG. 14B is a summary plane view of the insulating transformer of FIG. 14A.

In FIGS. 14A, 14B, a lead wire layer 12 is buried in the semiconductor substrate 11, and the primary coil pattern 14 is formed on the semiconductor substrate 11. And, the primary coil pattern 14 is connected via the lead portion 13 to the lead wire layer 12. On the primary coil pattern 14 is formed a planarization film 15, and on the planarization film 15 is formed the secondary coil pattern 17; the secondary coil pattern 17 is covered with a protective film 18. An opening portion 19 which exposes the center of the secondary coil pattern 17 is formed in the protective film 18, and by connecting a bonding wire to the center of the secondary coil pattern 17 via the opening portion 19, a lead wire from the secondary coil pattern 17 is obtained.

The primary coil pattern 14 and secondary coil pattern 17 can, for example, have a winding width of 5 to 10 μm, a thickness of 4 to 5 μm, and a maximum winding outer diameter of 500 μm.

FIGS. 15A-15L and FIGS. 16A-16H are cross-sectional views showing a conventional insulating transformer manufacturing method.

In FIG. 15A, impurities such as As, P, B, or similar are selectively injected into a semiconductor substrate 51, to form a leadout diffusion layer 52 in the semiconductor substrate 51 in order to form a lead from the center of the primary coil pattern 55a. The material of the semiconductor substrate 51 can, for example, be selected from among Si, Ge, SiGe, SiC, SiSn, PbS, GaAs, InP, GaP, GaN, ZnSe, or similar.

Next, as shown in FIG. 15B, plasma CVD or another method is used to form an insulating layer 53 on the semiconductor substrate 51 on which the leadout diffusion layer 52 has been formed. As the material of the insulating layer 53, for example, a silicon oxide film, silicon nitride film, or similar can be used.

Next, as shown in FIG. 15C, a photolithography technique is used to form a resist pattern 54, in which is provided an opening portion 54a corresponding to the leadout portion from the center of the primary coil pattern 55a, on the insulating layer 53.

Next, as shown in FIG. 15D, by etching the insulating layer 53 using as a mask the resist pattern 54 with an opening portion 54a formed, an opening portion 53a corresponding to a leadout portion from the center of the primary coil pattern 55a is formed in the insulating layer 53.

Next, as shown in FIG. 15E, the resist pattern 54 is stripped from the insulating layer 53 using a reagent.

Next, as shown in FIG. 15F, sputtering, evaporation deposition, or another method is used to form a conducting film 55 on the insulating layer 53. As the material of this conducting film 55, Al, Cu, or another metal can be used.

Next, as shown in FIG. 15G, by using photolithography techniques, a resist pattern 56 corresponding to the primary coil pattern 55a is formed.

Next, as shown in FIG. 15H, the resist pattern 56 is used as a mask to etch the conducting film 55, to form the primary coil pattern 55a on the insulating layer 53.

Next, as shown in FIG. 15I, the resist pattern 56 is stripped away from the primary coil pattern 55a using a reagent.

Next, as shown in FIG. 15J, a planarization film 57 is formed by plasma CVD or similar on the insulating layer 53 formed on the primary coil pattern 55a. As the material of the planarization film 57, for example, a silicon oxide film, silicon nitride film, or similar can be used.

Next, as shown in FIG. 15K, oblique etching or CMP (Chemical-Mechanical Polishing), or another method is used to flatten the planarization film 57, removing irregularities on the surface of the planarization layer 57.

Next, as shown in FIG. 15L, by using a photolithography technique, a resist pattern 58, provided with an opening portion 58a corresponding to a wire extraction portion at the outside end of a secondary coil pattern 60a, is formed on the planarization film 57.

Next, as shown in FIG. 16A, by etching the planarization film 57 using the resist pattern 58 provided with an opening portion 58a as a mask, an opening portion 57a corresponding to the wire extraction portion at the outside end of the secondary coil pattern 60a is formed in the planarization film 57.

Next, as shown in FIG. 16B, the resist pattern 58 is stripped from the planarization film 57 using a reagent.

Next, as shown in FIG. 16C, a separation layer 59 to separate the primary coil pattern 55a and secondary coil pattern 60a is formed on the planarization film 57. As the method of formation of the separation layer 59, a spin coating method or similar can be used to form a polyimide layer on the planarization film 57. Alternatively, as the method of formation of the separation layer 59, sputtering can be performed to deposit a silicon oxide film on the planarization film 57.

Next, as shown in of FIG. 16D, sputtering, evaporation deposition, or another method is used to form a conducting film 60 on the separation layer 59. As the material of the conducting film 60, Al, Cu, or another metal can be used.

Next, as shown in FIG. 16E, a photolithography technique is used to form a resist pattern 61 corresponding to a secondary coil pattern 60a.

Next, as shown in FIG. 16F, by etching the conducting film 60 using the resist pattern 61 as a mask, the secondary coil pattern 60a is formed on the separation layer 59.

Next, as shown in FIG. 16G, the resist pattern 61 is stripped from the secondary coil pattern 60a using a reagent.

Next, as shown in FIG. 16H, plasma CVD or another method is used to form a protection film 62 on the separation film 59 with the secondary coil pattern 60a formed on top. As the material of the protection film 62, for example, silicon oxide film, silicon nitride film, or similar can be used. Then, by using a photolithography technique and etching technique to pattern the protection film 62, the end portion and center portion of the secondary coil pattern 60a are exposed.

Moreover, for example in Patent Document 1 (Japanese Patent Laid-open No. 2005-5685 corresponding to U.S. Pat. No. 6,927,664), a method is disclosed in which, in a transformer device formed from a first wiring layer and a second wiring layer, when projecting onto one among the first wiring layer and the second wiring layer from one among the vertical upward direction and the vertical downward direction, the projected outer shape has a symmetric shape with reference to a reference plane stipulated in advance, and moreover, by configuring the portions of the projected outer shape which intersect the first wiring layer and second wiring layer so as not to intersect by using the first wiring layer and second wiring layer, the occupied area of the transformer device is reduced.

Further, in Patent Document 2 (U.S. Patent Application Publication No. 2005/230837), an air-core transformer is disclosed in which first and second coils are surrounded by protective rings in the horizontal direction.

And, for example in Patent Document 3 (Japanese Patent Laid-open No. 2005-310959), a method is disclosed in which, by constructing a laminated-layer transformer from magnetic sheets on the surfaces of each of which are provided coil conductors, and glass insulating layers provided at the surfaces of each, while suppressing drops in the amount of coupling between coils of the laminated-layer transformer, the insulation breakdown voltage between coils can be raised without increasing the height dimensions of components.

However, in the method of manufacture of an insulating transformer of FIGS. 15, 16, when employing a method in which the separation layer 59 is formed by spin-coating a polyimide layer, the film thickness of the separation layer 59 is limited to 20 μm or less in order to maintain flatness of the surface.

And, in a method in which sputtering deposition of a silicon oxide film is used as the separation layer 59, the film thickness of the separation layer 59 is limited to 10 μm or less, in consideration of the surface unevenness due to thermal stress during film deposition and the film deposition rate.

On the other hand, in automotive, industrial equipments, and other applications, an ESD (electrostatic discharge) tolerance voltage of from 15 to 30 kV, equivalent to the electrostatic charge of the human body, is required; if a microtransformer such as that of FIG. 16 combines a primary-side circuit and secondary-side circuit packaged as an IC, then voltages in this 15 to 30 kV range are applied to the separation layer 59. Dielectric breakdown occurs when 8 to 11 kV of ESD is applied to a polyimide layer of thickness 20 μm, or when approximately 7 kV of ESD is applied to a silicon oxide film of thickness 10 μm. Therefore, there has been a problem that, if a voltage between 15 and 30 kV is applied to the separation layer 59, dielectric breakdown of the separation layer 59 occurs.

Therefore, an object of this invention is to provide an insulating transformer and power conversion device which, while suppressing the aging degradation and improving reliability and environmental tolerance, alleviates the influence of noise originating in external magnetic flux, and enables exchange of signals while electrically insulating the low-voltage side and high-voltage side.

Further objects and advantages of the invention will be apparent from the following description of the invention.

SUMMARY OF THE INVENTION

In order to attain the above object, the insulating transformer according to the first aspect of the invention comprises: a semiconductor substrate, on which either one of primary windings and secondary windings is formed; an insulating substrate, on which the other one of the primary windings and the secondary windings is formed, positioned on the semiconductor substrate such that the primary windings and the secondary windings face each other; and an insulating spacer layer, which insulates and separates the primary windings and secondary windings so as to maintain a constant interval between the semiconductor substrate and the insulating substrate.

By this means, an interval, which is not less than several tens of μm, can be secured between the primary windings and the secondary windings of the insulating transformer, without detracting the planarity or uniformity of the surfaces of the primary windings and secondary windings. Hence, while enabling miniaturization of insulating transformers using miniaturization machining techniques, an ESD tolerance voltage of 15 to 30 kV can be secured, the effect of noise arising from external magnetic flux can be alleviated while improving reliability and environmental tolerance, and signals can be exchanged while maintaining the electrical insulation of the low-voltage side and high-voltage side.

The insulating transformer according to the second aspect of the invention comprises a penetrating hole formed in the insulating substrate, and an electrode for wire extraction, formed on the second main face opposite to the first main face of the insulating substrate on which are formed the primary windings or secondary windings, and connected to the primary windings or secondary windings via the penetrating hole.

By this means, when the primary windings or secondary windings formed on the insulating substrate is positioned in opposition to the secondary windings or primary windings formed on the semiconductor substrate, a wire from the primary windings or secondary windings formed on the insulating substrate can be extracted, and the primary windings or secondary windings formed on the insulating substrate can be driven.

In the insulating transformer according to the third aspect of the invention, the insulating spacer layer is an organic insulating layer in film form.

By this means, by enclosing an organic insulating layer in film form between the semiconductor substrate on which is formed one of the primary windings and the secondary windings and the insulating substrate on which is formed the other of the primary windings and the secondary windings, while maintaining the interval between the primary windings and the secondary windings of the insulating transformer at several tens of μm or greater, the primary windings and secondary windings can be positioned in opposition, and while enabling miniaturization of the insulating transformer using miniaturization machining techniques, an ESD tolerance voltage of 15 to 30 kV can be secured.

In the insulating transformer according to the fourth aspect of the invention, the organic insulating layer is a polyimide layer in film form.

By this means, by enclosing a polyimide film between the semiconductor substrate on which is formed one of the primary windings and the secondary windings and the insulating substrate on which is formed the other of the primary windings and the secondary windings, while maintaining the interval between the primary windings and the secondary windings of the insulating transformer at several tens of μm or greater, the primary windings and secondary windings can be positioned in opposition, and while enabling miniaturization of the insulating transformer using miniaturization machining techniques, an ESD tolerance voltage of 15 to 30 kV can be secured.

In the insulating transformer according to the fifth aspect of the invention, the relative permittivity of the insulating substrate on which the primary windings or secondary windings is formed is greater than the relative permittivity of the insulating spacer layer.

By this means, the electric field occurring at the surface of the insulating spacer layer can be alleviated, and the voltage actually applied to the insulating spacer layer can be made smaller than that applied due to ESD, so that the ESD tolerance voltage can be increased.

The insulating transformer according to the sixth aspect of the invention further comprises an insulating film, formed below the insulating spacer layer such that the primary windings or the secondary windings are covered.

By this means, the voltage applied by ESD can be received by the two-layer structure of the insulating spacer layer and the insulating film, so that the ESD tolerance voltage can be further increased.

The power conversion device according to the seventh aspect of the invention comprises: a pair of switching elements, connected in series so as to operate as an upper arm and lower arm respectively, and conducting and blocking current flowing to the load; a control circuit, which generates control signals to specify conduction and non-conduction for the switching elements; a driving circuit, which drives the control terminals of the switching elements based on the control signals; and an insulating transformer, in which primary windings and secondary windings are positioned in mutual opposition, and the primary windings and secondary windings are insulated and separated by an insulating layer in film form such that the control circuit and the driving circuit are insulated.

By this means, while enabling miniaturization of insulating transformers using miniaturization machining techniques, an ESD tolerance voltage of 15 to 30 kV can be secured, the reliability of the insulating transformer can be secured, and the effect of noise arising from external magnetic flux can be alleviated, and signals can be exchanged while maintaining electrical insulation of the low-voltage side and high-voltage side. Hence, there is no longer need to use photocouplers, and environmental tolerance can be enhanced while suppressing the aging degradation.

As explained above, by means of this invention, an insulating transformer can be miniaturized using miniaturization machining techniques, the interval between the primary windings and secondary windings of the insulating transformer can be made several tens of μm or greater, the effect of noise arising from external magnetic flux can be alleviated while improving reliability and environmental tolerance, and signals can be exchanged while maintaining the electrical insulation of the low-voltage side and high-voltage side.

BRIEF DESCRIPTION OF THE DRAWINGS

FIGS. 2A, 2B are cross-sectional views briefly showing the configuration of the insulating transformer of a first embodiment of the invention.

FIGS. 15A-15L are cross-sectional views showing a method of manufacture of insulating transformers of the prior art.

DETAILED DESCRIPTION OF PREFERRED EMBODIMENTS

Below, embodiments for the insulated transformers in the invention are explained with reference to the drawings.

Figure 1:
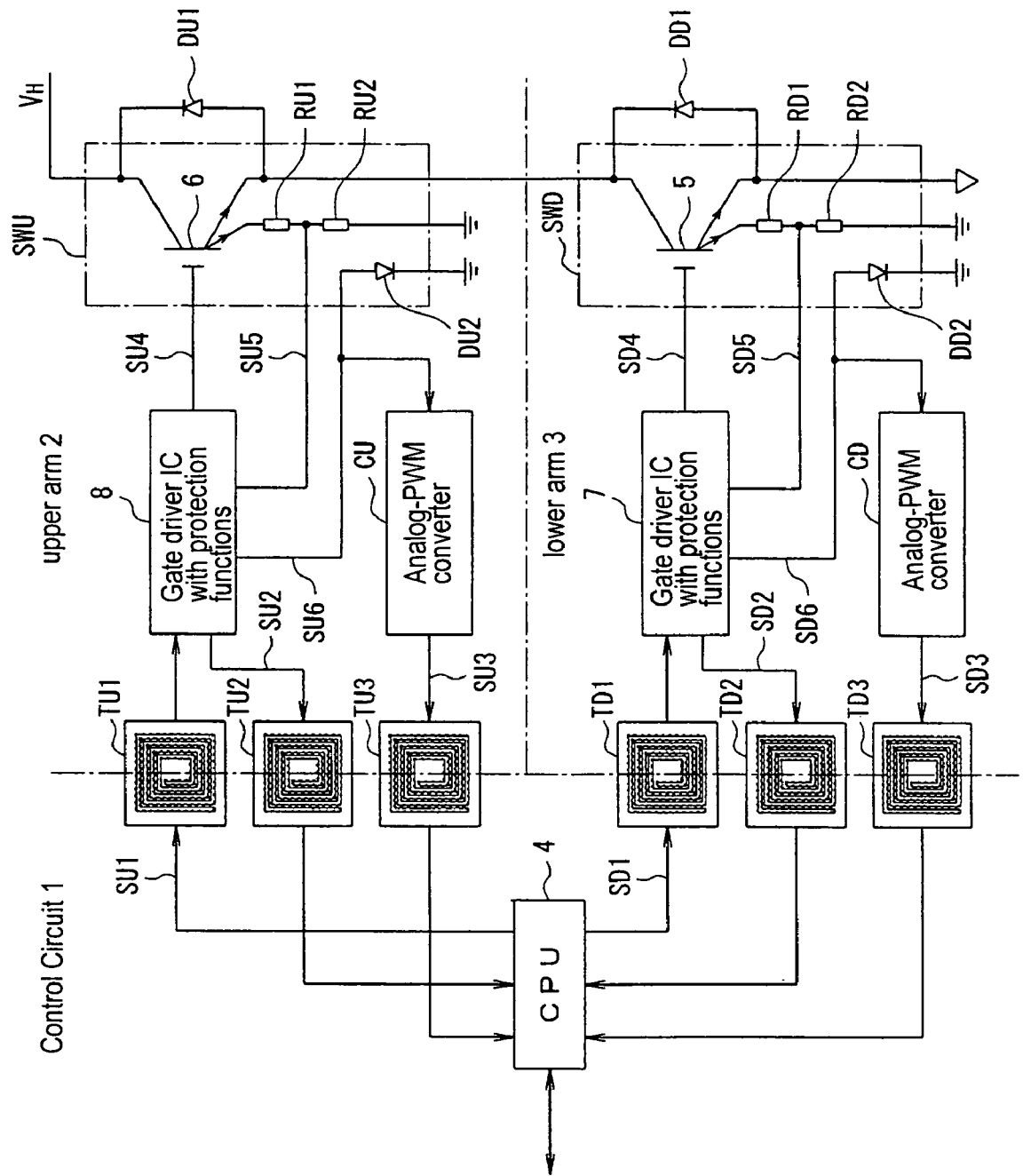
FIG. 1 is a block diagram briefly showing the configuration of an intelligent power module for a buck-boost converter to which the insulating transformer of one embodiment of the invention is applied.

FIG. 1 is a block diagram briefly showing the configuration of an intelligent power module (IPM) for a buck-boost converter to which a power electronics equipment is applied, in one embodiment of the invention.

In FIG. 1, the intelligent power module for the buck-boost converter is provided with switching elements SWU, SWD which cause current to be passed or blocked from flowing to the load, and a control circuit 1 which generates control signals directing the switching elements SWU, SWD to conduct or not to conduct. Here, the control circuit 1 can comprise a CPU 4 or logic IC, or a system LSI equipped with a logic IC and CPU, or similar.

The switching elements SWU and SWD are connected in series so as to operate the upper arm 2 and lower arm 3, respectively. An IGBT 6, which performs switching operation based on gate signals SU4, is provided in the switching element SWU, and a flywheel diode DU1, which passes current in the direction opposite to the current flowing in the IGBT 6, is connected in parallel to the IGBT 6. Further, on the chip on which the IGBT 6 is formed, a temperature sensor used as means of measurement of VF changes of the diode DU2 arising from chip temperature changes, and a current sensor which divides the emitter current of the IGBT 6 using resistances RU1 and RU2 and detects the main circuit current, are provided.

Also, an IGBT 5, which performs switching operation based on gate signals SD4, is provided in the switching element SWD, and a flywheel diode DD1, which passes current in the direction opposite to the current flowing in the IGBT 5, is connected in parallel to the IGBT 5. Further, on the chip on which the IGBT 5 is formed, a temperature sensor used as means of measurement of VF changes of the diode DD2 arising from chip temperature changes, and a current sensor which divides the emitter current of the IGBT 5 using resistances RD1 and RD2 and detects the main circuit current, are provided.

Moreover, on the side of the upper arm 2, a gate driver IC 8 with protection functions is provided which, while monitoring an overheating detection signal SU6 from the temperature sensor and an overcurrent detection signal SU5 from the current sensor, generates gate signals SU4 to drive the control terminal of the IGBT 6. In addition, an analog-PWM converter CU, which generates PWM signals corresponding to the temperature of the IGBT 6, is provided. An auto-diagnostic circuit which generates state signals for the switching elements SWD and SWU can be provided in the gate driver IC 8 with protection functions; and the auto-diagnostic circuit can generate state signals for the switching elements SWD and SWU.

Moreover, on the side of the lower arm 3, a gate driver IC 7 with protection functions is provided which, while monitoring an overheating detection signal SD6 from the temperature sensor and an overcurrent detection signal SD5 from the current sensor, generates gate signals SD4 to drive the control terminal of the IGBT 5. In addition, an analog-PWM converter CD, which generates PWM signals corresponding to the temperature of the IGBT 5, is provided.

Air-core type insulating transformers TU1 to TU3 and TD1 to TD3 are respectively inserted between the control circuit 1 grounded to the vehicle body, and the upper arm 2 and lower arm 3 at high voltage. In the control circuit 1, the air-core type insulating transformers TU1 to TU3 and TD1 to TD3 are used to exchange signals with the upper arm 2 and lower arm 3, while maintaining the electrical insulation.

That is, in the upper arm 2, PWM signals SU1 for gate driving, output from the CPU 4, are input to the gate driver IC 8 with protection functions via the air-core insulating transformer TU1. And, alarm signals SU2 output from the gate driver IC 8 with protection functions are input to the CPU 4 via the air-core insulating transformer TU2. And, IGBT chip temperature PWM signals SU3 output from the analog-PWM converter CU are input to the CPU 4 via the air-core insulating transformer TU3.

On the other hand, in the lower arm 3, PWM signals SD1 for gate driving, output from the CPU 4, are input to the gate driver IC 7 with protection functions via the air-core insulating transformer TD1. And, alarm signals SD2 output from the gate driver IC 7 with protection functions are input to the CPU 4 via the air-core insulating transformer TD2. And, IGBT chip temperature PWM signals SD3 output from the analog-PWM converter CD are input to the CPU 4 via the air-core insulating transformer TD3.

Here, air-core insulating transformers TU1 to TU3 and TD1 to TD3 are each provided with primary windings on the transmission side and secondary windings on the receiving side. And, the primary windings and secondary windings of each of the air-core insulating transformers TU1 to TU3 and TD1 to TD3 are positioned in opposition. For example, the primary windings and secondary windings of each of the air-core insulating transformers TU1 to TU3 and TD1 to TD3 are formed on different substrates, and the substrates on which the primary windings and secondary windings of each of the air-core insulating transformers TU1 to TU3 and TD1 to TD3 are formed can be laminated with insulating spacer layers intervening. Also, the air-core insulating transformers TU1 to TU3 and TD1 to TD3 can be formed by semiconductor process technology or other miniaturization machining technology.

As the insulating spacer layers which insulate and separate the primary windings and secondary windings of the air-core insulating transformers TU1 to TU3 and TD1 to TD3, polyimide films or other organic insulating layers in film form can be used. Here, the thickness of the insulating spacer layers can be set so as to ensure an ESD tolerance voltage of 15 to 30 kV, that is, for example, the thickness can be set to approximately several tens to several hundreds of μm.

The CPU 4 generates PWM signals SD1 and SU1 for gate driving, which specify whether the IGBTs 5 and 6 are to be conducting or non-conducting; these gate-driving PWM signals SD1 and SU1 are transmitted with insulation to the gate driver ICs 7 and 8 with protection functions via the air-core insulating transformers TD1 and TU1, respectively. Then, based on the gate-driving PWM signals SD1 and SU1, the gate driver ICs 7 and 8 generate gate signals SD4 and SU4 respectively, and cause the IGBTs 5 and 6 to perform switching operation by driving the control terminals of the IGBTs 5 and 6.

Here, overheating detection signals SD6, SU6 output from temperature sensors are input to the respective gate driver ICs 7, 8 with protection functions, and overcurrent detection signals SD5, SU5 output from current sensors are input to the respective gate driver ICs 7, 8 with protection functions. And, when the threshold at which an IGBT 5, 6 does not fail is exceeded, the gate driver ICs 7, 8 with protection functions transmit alarm signals SD2, SU2 to the CPU 4 via the air-core insulating transformers TD2, TU2, respectively. Upon receiving an alarm signal SD2, SU2 from the gate driver ICs 7, 8 with protection functions, the CPU 4 halts generation of gate-driving PWM signals SD1, SU1, and blocks current flowing through the IGBT 5 or 6.

The gate driver ICs 7, 8 with protection functions, upon judging that an IGBT is below a threshold value at which failure occurs based on overheating detection signals SD6, SU6 output from temperature sensors and overcurrent detection signals SD5, SU5 output from current sensors, cancel the alarm signals SD2, SU2 after a fixed length of time has elapsed.

When more detailed monitoring is to be performed, overheating detection signals SD6, SU6 output from temperature sensors are input to analog-PWM converters CD, CU respectively. Then, the analog-PWM converters CD, CU convert the analog values of the overheating detection signals SD6, SU6 into digital signals, to generate IGBT chip temperature PWM signals SD3, SU3, and the IGBT chip temperature PWM signals SD3, SU3 are transmitted to the CPU 4 via the air-core insulating transformers TD3, TU3 respectively. The CPU 4 calculates the chip temperatures of the IGBTs 5, 6 from the IGBT chip temperature PWM signals SD3, SU3, and can reduce the switching frequencies of the IGBTs 5, 6 in steps according to a plurality of threshold value stages set in advance, and can halt switching.

Here, the primary windings and secondary windings of the air-core insulated transformers TU1 to TU3 and TD1 to TD3 are formed using miniaturization machining techniques so as to face each other, and the winding diameters of the primary windings and secondary windings can be reduced in size by this means. Moreover, the interval between the primary windings and secondary windings can be reduced. Hence, while raising the coupling coefficient between the primary windings and secondary windings, the area through which magnetic flux of the primary windings and secondary windings is linked can be decreased, so that the effects of noise arising from external magnetic flux can be alleviated, and signals are exchanged while the electrical insulation of the low-voltage side and high-voltage side is maintained, so that photocouplers do not need to be used, and environmental tolerance can be enhanced while suppressing the aging degradation.

Further, in order to insulate and separate the primary windings and secondary windings of the air-core insulating transformers TU1 to TU3 and TD1 to TD3, by forming the primary and secondary windings of the air-core insulating transformers TU1 to TU3 and TD1 to TD3 on different substrates, and by positioning these substrates such that the primary windings and secondary windings are in mutual opposition while holding the interval between these substrates constant using a spacer layer, an interval between the primary windings and secondary windings of several tens of μm or greater can be secured without detracting the flatness or uniformity of the surfaces on which the primary windings and secondary windings of the air-core insulating transformers TU1 to TU3 and TD1 to TD3 are formed. Hence, while enabling miniaturization of the air-core insulating transformers TU1 to TU3 and TD1 to TD3 using miniaturization machining techniques, an ESD tolerance voltage of 15 to 30 kV can be secured, and while improving the reliability and the environmental tolerance, the effect of noise arising from external magnetic flux can be alleviated, and signals can be exchanged while electrically insulating the control circuit 1 and the upper arm 2 and lower arm 3.

FIGS. 2A, 2B are cross-sectional views briefly showing the configuration of the insulating transformer of a first embodiment of the invention.

In FIGS. 2A, 2B, the insulating transformer is provided with a primary-side coil 110, formed on an insulating substrate 111, and with a secondary-side coil 100, formed on a semiconductor substrate 101.

Here, in the secondary-side coil 100, a lead wire layer 102 is buried in the semiconductor substrate 101, and the secondary coil pattern 104 and electrodes patterns 105, 106 are formed on the semiconductor substrate 101, with an insulating layer 103 intervening. The gate driver ICs 7 and 8 with protection functions, analog-PWM converters CU and CD, and other integrated circuitry, or the switching elements SWU and SWD, and similar shown in FIG. 1 may be formed on the semiconductor substrate 101. The material of the semiconductor substrate 101 can, for example, be selected from among Si, Ge, SiGe, SiC, SiSn, PbS, GaAs, InP, GaP, GaN, ZnSe, or similar. Impurities such as B, As, or P can be implanted into the semiconductor substrate 101 to form a high-concentration impurity diffusion layer for use as the lead wire layer 102.

Then, the end portion positioned in the center portion of the secondary coil pattern 104 is connected to the electrode pattern 106 via the buried wire 107, lead wire layer 102, and buried wire 108. Also, the end portion positioned on the outer perimeter of the secondary coil pattern 104 is connected to the electrode pattern 105. And, a protection film 109 is formed on the secondary coil pattern 104 and electrode patterns 105 and 106, such that the connection surfaces of the electrode patterns 105 and 106 are exposed. As the material of the secondary coil pattern 104 and electrode pattern 105, Al, Cu, or another metal can be used; as the material of the protection film 109, silicon oxide film, silicon nitride film, or similar can be used.

On the other hand, in the case of the primary-side coil 110, a primary coil pattern 113 and electrode pattern 114 are formed on the first main face of the insulating substrate 111, and the primary coil pattern 113 and electrode pattern 114 are covered by an insulating layer 116 such that the connection surface of the electrode pattern 114 is exposed. As the insulating substrate 111, for example, a glass substrate, ceramic substrate, resin substrate, or similar can be used. Alternatively, a Si substrate or other semiconductor substrate may be used. When the material of the insulating substrate 111 does not have insulating properties, an insulating layer may be formed on the surface in order to provide the substrate with insulating properties.

On the other hand, a wire extraction electrode pattern 115 is formed on the second main face of the insulating substrate 111 opposite to the first main face, and the electrode pattern 115 is connected to the electrode pattern 114 via a penetrating hole 112 formed in the insulating substrate 111.

Then, an insulating spacer layer 117 is laminated onto the first main face of the insulating substrate 111, such that the connection portions of the electrode patterns 114, 115 as well as the primary coil pattern 113 and electrode pattern 114 are covered, and an adhesive layer 118 is formed on the insulating spacer layer 117.

As the materials of the primary coil pattern 113 and the electrode patterns 114 and 115, a metal such as Al and Cu can be used, and as the material of the protection film 116, silicon oxide film, silicon nitride film, or similar can be used. As the insulating spacer layer 117, an organic insulating layer in film form or sheet form can be used; for example, polyimide film can be employed. The thickness of the insulating spacer layer 117 can be set to 20 µm or greater. In order to stably secure an ESD tolerance voltage of 15 to 30 kV, equivalent to the electrostatic charge on a human body, it is preferable that the thickness of the insulating spacer layer 117 be set to 100 µm or greater. As the adhesive layer 118, an epoxy resin or other adhesive film can be used. The coil wire width in the secondary coil pattern 104 and primary coil pattern 113 can, for example, be 5 to 10 µm, the thickness can be 3 to 5 µm, and the maximum winding outer diameter can be 500 µm.

Then, the insulating substrate 111 on which the primary coil pattern 113 has been formed is fixed onto the semiconductor substrate 101 by means of the adhesive layer 118, such that the face on which the primary coil pattern 113 has been formed faces the semiconductor substrate 101.

Then, by connecting the electrode patterns 105 and 106 to bonding wires, leads from the secondary coil pattern 104 are obtained, and by connecting a bonding wire to the electrode pattern 115, a lead from the primary coil pattern 113 is obtained.

By this means, the interval between the secondary coil pattern 104 and the primary coil pattern 113 can be maintained at several tens of µm or more without detracting the flatness or uniformity of the surfaces on which the secondary coil pattern 104 and primary coil pattern 113 are formed. In addition, semiconductor process technology can be used to form the secondary coil pattern 104 and primary coil pattern 113. Hence, an insulating transformer can be integrated onto a semiconductor substrate 101 while maintaining the interval between the secondary coil pattern 104 and the primary coil pattern 113 at several tens of µm or greater, and a signal transmission circuit can be miniaturized while securing the ESD tolerance voltage of 15 to 30 kV.

In the above-described embodiment, the secondary coil pattern 104 was formed on the semiconductor substrate 101, and the primary coil pattern 113 was formed on the insulating substrate 111. However, the secondary coil pattern 104 and the primary coil pattern 113 may be formed on the insulating substrate 111 and the semiconductor substrate 101 respectively.

FIGS. 3A-3H and FIGS. 4A-4F are cross-sectional views showing a method of manufacture of the primary-side coil of the insulating transformer of FIGS. 2A, 2B.

Figure 3A:
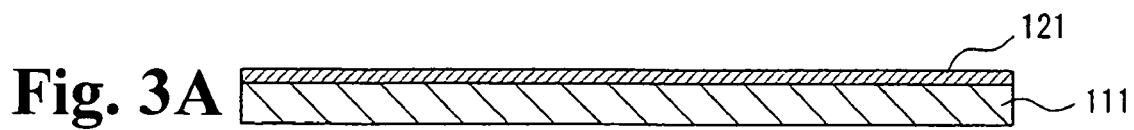
FIGS. 3A-3H are cross-sectional views showing a method of manufacture of the primary-side coil of the insulating transformer of FIGS. 2A, 2B.

In FIG. 3A, sputtering, evaporation deposition, or another method is used to form a conducting film 121 on an insulating substrate 111. As the material of the conducting film 121, Al, Cu, Au, Ag, or another metal can be used. The material of the conducting film 121 can be determined based on compatibility with downstream processes and the specifications demanded by the assembly process. For example, when wire bonding is used for the wire leads from the primary coil pattern 113, it is preferable that Al be used. Also, the thickness of the conducting film 121 can be determined according to the direct-current resistance necessary for the coil element. For example, the thickness can be set to approximately 3 µm. In order to improve the close contact between the primary coil pattern 113 and the insulating substrate 111, Ti may be formed as a layer below the Al.

Figure 3B:
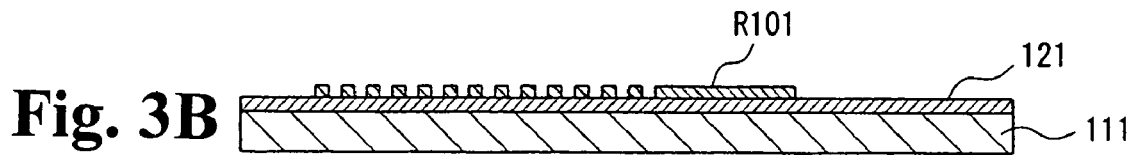

Next, as shown in FIG. 3B, spin coating or another method is used to apply a photoresist liquid onto the conducting film 121, and a reducing projection exposure method is used to expose the photoresist liquid. A resist pattern R101 corresponding to a primary coil pattern 113 and electrode pattern 114 is formed on the conducting film 121 by developing after exposure. The film thickness of the resist pattern R101 can be set so as to withstand the subsequent etching process. Also, the line width of the primary coil pattern 113 can, for example, be set to 5 µm, and the interval between pattern lines can, for example, be set to 1 μm. If the interval between pattern lines exceeds 3 μm, a same-size (non-reducing) exposure device may be used.

Figure 3C:
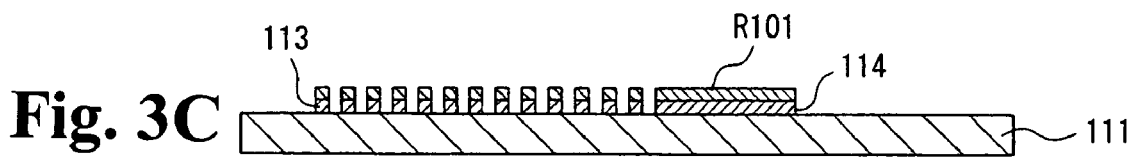

Next, as shown in FIG. 3C, RIE (reactive ion etching) or another method is employed, using the resist pattern R101 as a mask, to pattern the conducting film 121, and by this means a primary coil pattern 113 and electrode pattern 114 are formed on the insulating substrate 111. When patterning the conducting film 121, instead of RIE, an ion beam etching method, plasma etching method, or similar may be used. Alternatively, a wet etching method and lift-off method may be used.

Figure 3D:
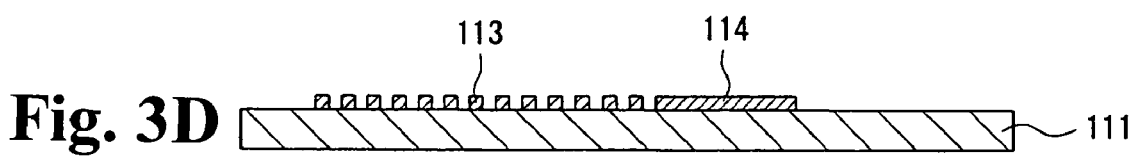

Next, as shown in FIG. 3D, the resist pattern R101 is stripped from the primary coil pattern 113 and electrode pattern 114 by using a reagent, and the primary coil pattern 113 and electrode pattern 114 are washed.

Figure 3E:
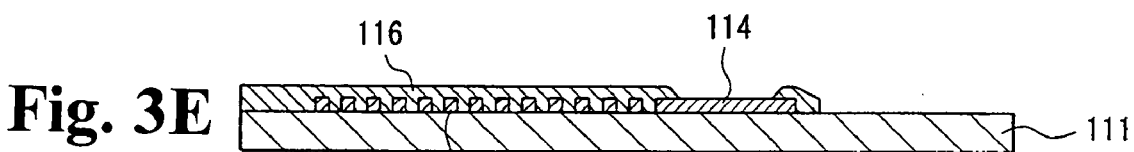

Next, as shown in FIG. 3E, a photosensitive polyimide is applied to the insulating substrate 111 on which are formed the primary coil pattern 113 and the electrode pattern 114. After prebaking, exposure and development are performed to form a protection film 116 covering the primary coil pattern 113, while the connection surface of the electrode pattern 114 being exposed, on the insulating substrate 111.

As the protection film 116, instead of a photosensitive polyimide, a non-photosensitive polyimide and a silicon oxide film, silicon nitride film, or other inorganic material may be used. For example, when using a silicon oxide film as the protection film 116, plasma CVD or another method is used to form the silicon oxide film on the insulating substrate 111, on which the primary coil pattern 113 and electrode pattern 114 have been formed. Then, by using a photolithography technique and an etching technique, an opening portion which exposes the connection surface of the electrode pattern 114 can be formed in the silicon oxide film.

Figure 3F:
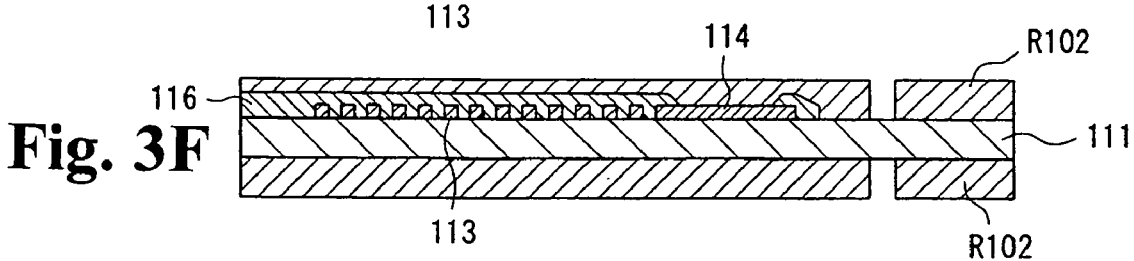

Next, as shown in FIG. 3F, dry film resist for use in sandblasting is laminated onto both sides of the insulating substrate 111. Then, by exposing and developing the dry film resist, a mask for hole formation R102 to fabricate a penetrating hole 112 is formed on both sides of the insulating substrate 111. The diameter of the hole of the mask for hole formation R102 can, for example, be 130 μm.

Figure 3G:
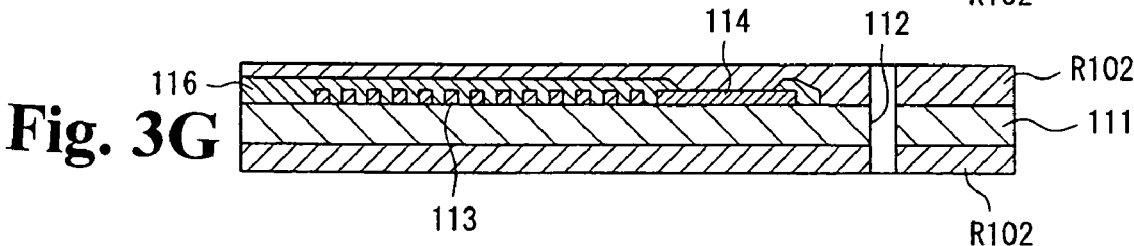

Next, as shown in FIG. 3G, by performing sandblasting of the insulating substrate 111 with the mask for hole formation R102 intervening, a penetrating hole 112 is formed in the insulating substrate 111. When forming the penetrating hole 112, instead of sandblasting, such other methods as laser machining, ultrasonic machining, drilling, dry etching, or similar may be used. These methods may be selected based on cost, machining speed, the minimum machinable diameter, and other matters.

Figure 3H:
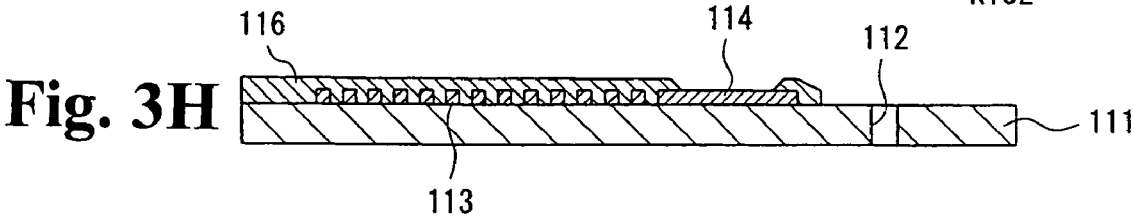

Next, as shown in FIG. 3H, the mask for hole formation R102 is stripped from the insulating substrate 111, and the insulating substrate 111 is cleaned. When the diameter of the hole of the mask for hole formation R102 was 130 μm, the diameter of the penetrating hole 112 was 160 μm at the surface of the insulating substrate 111.

Figure 4A:
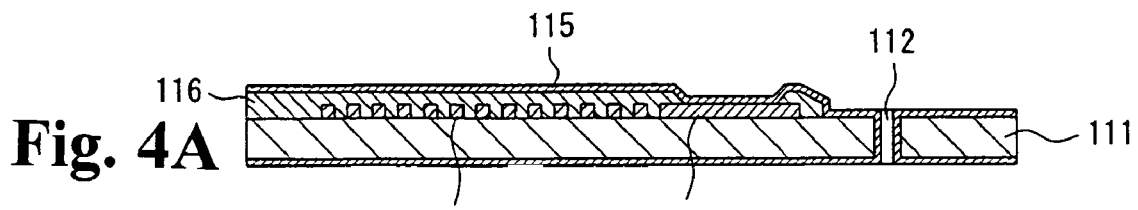
FIGS. 4A-4F are cross-sectional views showing a method of manufacture of the primary-side coil of the insulating transformer of FIGS. 2A, 2B.

Next, as shown in FIG. 4A, sputtering, evaporation deposition, or another method is used to form a side wall of the penetrating hole 112 and conducting films 122 on both faces of the insulating substrate 111. As the material of the conducting films 122, Al, Cu, Au, Ag, or another metal can be used. In order to improve the close contact between the electrode pattern 115 and the insulating substrate 111, Ti may be formed as a layer below the Al.

Figure 4B:
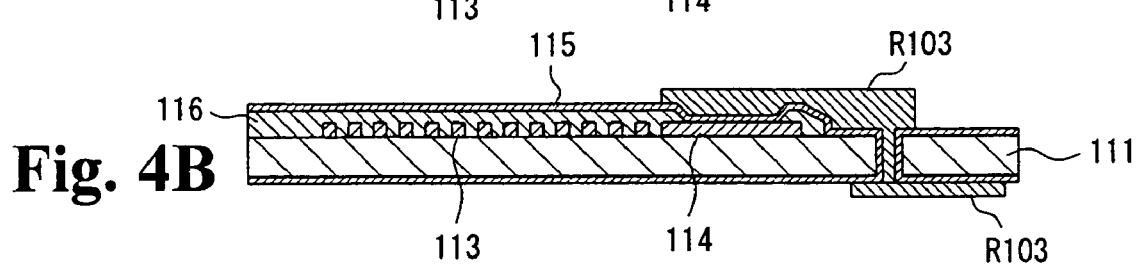

Next, as shown in FIG. 4B, a dry film resist is laminated onto both sides of the insulating substrate 111. Then, by exposing and developing the dry film resist, a resist pattern R103 corresponding to an electrode pattern 115 is formed on both faces of the insulating substrate 111. As the method used to form the resist pattern R103, in addition to a method using a dry film resist, a method may be employed in which resist liquid is applied to the insulating substrate 111. However, because a penetrating hole 112 has been formed in the insulating substrate 111, the spin coating method is not suitable, and use of a spray application method is preferable.

Figure 4C:
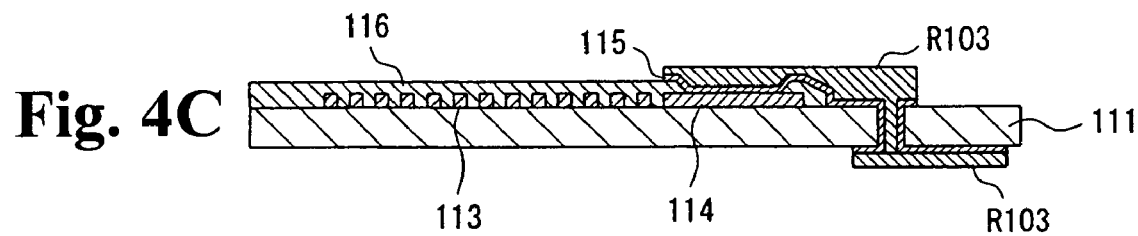

Next, as shown in FIG. 4C, the resist pattern R103 is used as a mask when employing RIE (reactive ion etching) or another method to pattern conducting film 122, to form an electrode pattern 115, connected to the electrode pattern 114 via the penetrating hole 112, on the insulating substrate 111. When patterning the conducting film 122, instead of RIE, ion beam etching, plasma etching, or another method may be used. Alternatively, a wet etching method and lift-off method may be used.

Figure 4D:
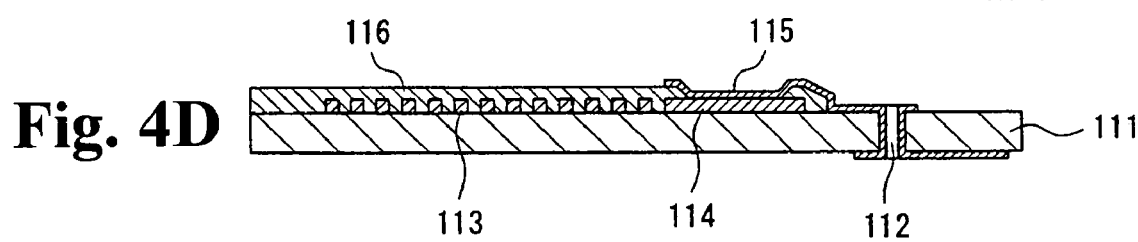

Next, as shown in FIG. 4D, the resist pattern R103 is stripped from the insulating substrate 111, and the insulating substrate 111 is washed.

Figure 4E:
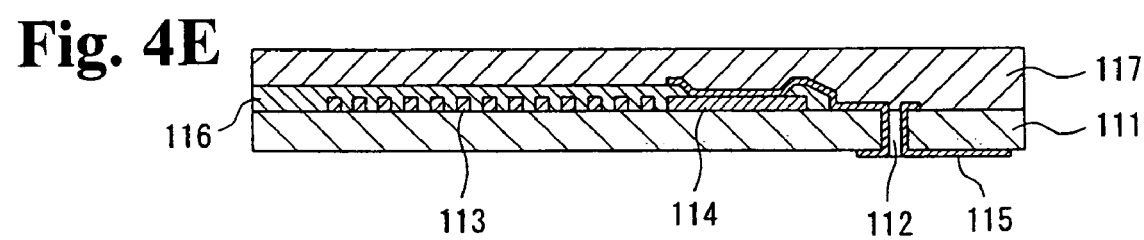

Next, as shown in FIG. 4E, an insulating spacer layer 117 is formed on a first main face of the insulating substrate 111 on which the primary coil pattern 113 and electrode pattern 114 are formed. When forming the insulating spacer layer 117 on the first main face of the insulating substrate 111, a polyimide film can be laminated onto the first main face of the insulating substrate 111, with an adhesive sheet intervening. In this case, for example, the thickness of the adhesive sheet can be 10 μm, and the thickness of the polyimide film can be 125 μm. Then, after laminating the polyimide film onto the first main surface of the insulating substrate 111 with the adhesive sheet intervening, heat treatment can be performed at 200° C. for 20 minutes to heat-harden the adhesive sheet.

As the insulating spacer layer 117, instead of polyimide film, a liquid crystal polymer film, polyamide resin film, or other organic resin film may be used. Instead of an organic resin film, a glass plate, ceramic substrate, or other inorganic material may be used. The material can be selected and determined based on the insulating characteristics of the materials. However, because the dielectric breakdown voltage of glass and ceramics is in a range from 100 to 150 kV/mm, and the dielectric breakdown voltage of polyimide is in a range from 300 to 400 kV/mm, it is preferable that a polyimide be used in order to secure an adequate dielectric breakdown voltage for a given film thickness.

Figure 4F:
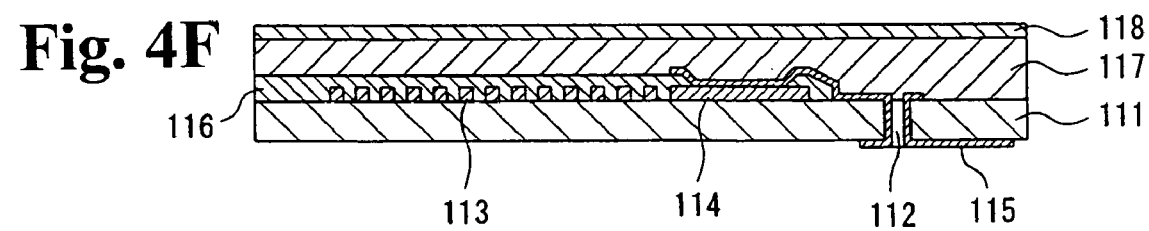

Next, as shown in FIG. 4F, an adhesive layer 118 is deposited on the insulating spacer layer 117. For example, after depositing the adhesive layer 118 on the insulating spacer layer 117, the insulating substrate 111 can be diced to obtain chips, and DAF (die attachment film) tape can be used to mount the insulating substrate 111 on which the primary coil pattern 113 is formed onto a semiconductor substrate 101.

When using a polyimide film of 125 μm thick with an adhesive sheet of thickness 10 μm as the insulating spacer layer 117 with the primary coil pattern 113 and secondary coil pattern 104 having a line-width of 5 μm, interval between pattern lines of 1 μm, and film thickness of 3 μm, the ESD tolerance voltage was 25 kV. Also, the coupling coefficient between the primary coil pattern 113 and secondary coil pattern 104 was 0.4, and the transformer operated normally. In order to raise the coupling coefficient between the primary coil pattern 113 and the secondary coil pattern 104, the thickness of the insulating spacer layer 117 may be decreased to 75 μm or 50 μm. However, to this extent, the ESD tolerance voltage will be reduced. Therefore, the thickness of the insulating spacer layer 117 must be selected based on both the transformer characteristics and the ESD tolerance.

Figure 5:
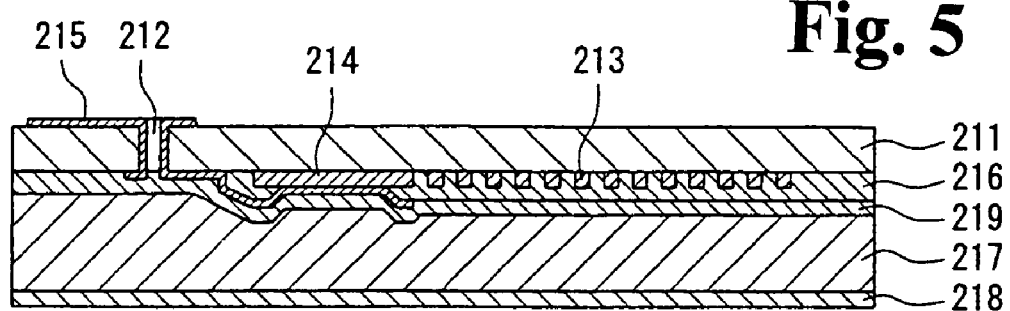
FIG. 5 is a cross-sectional view briefly showing the configuration of the primary-side coil of the insulating transformer of a second embodiment of the invention.
Figure 6:
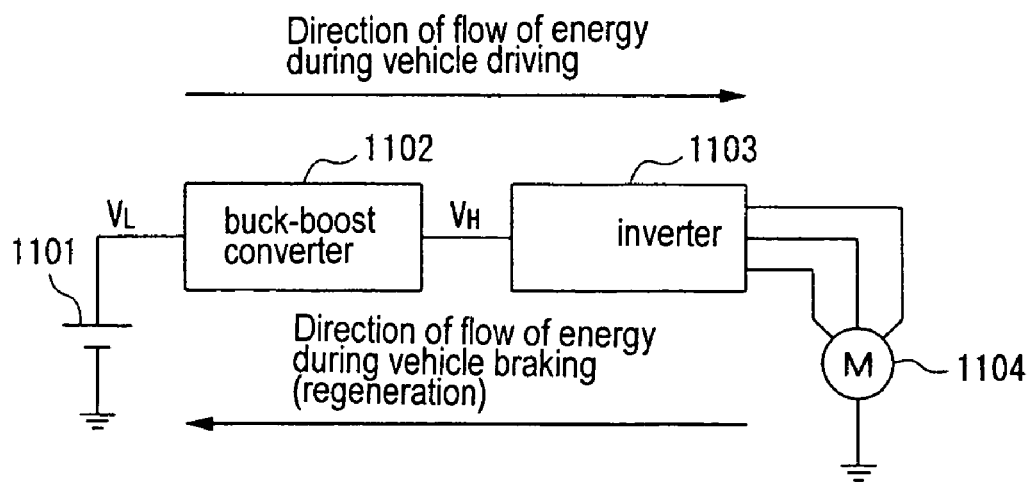
FIG. 6 is a block diagram briefly showing the configuration of a vehicle driving system employing a buck-boost converter of the prior art.
Figure 7:
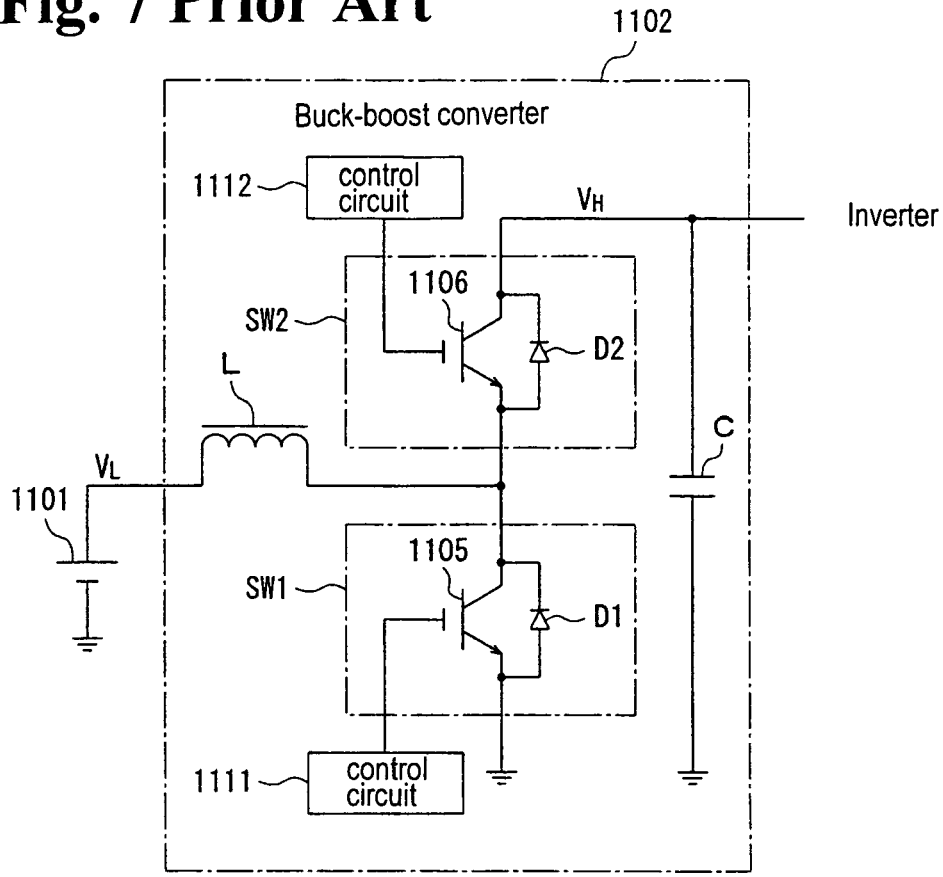
FIG. 7 is a block diagram briefly showing the configuration of the buck-boost converter of FIG. 6.
Figure 8:
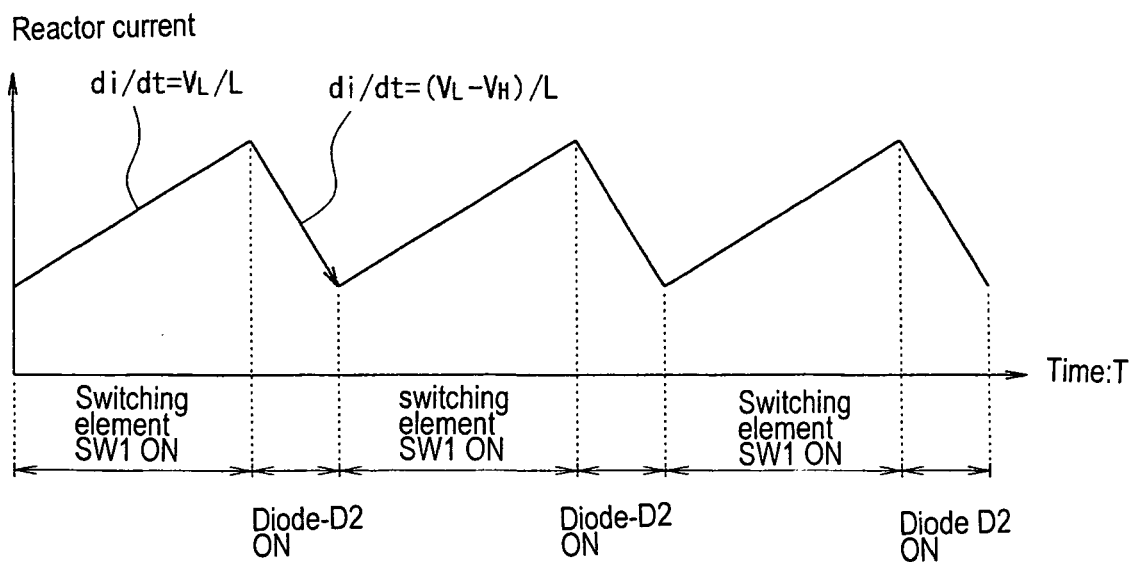
FIG. 8 shows the waveform of the current flowing in the reactor of FIG. 7 during step-up operation.
Figure 9:
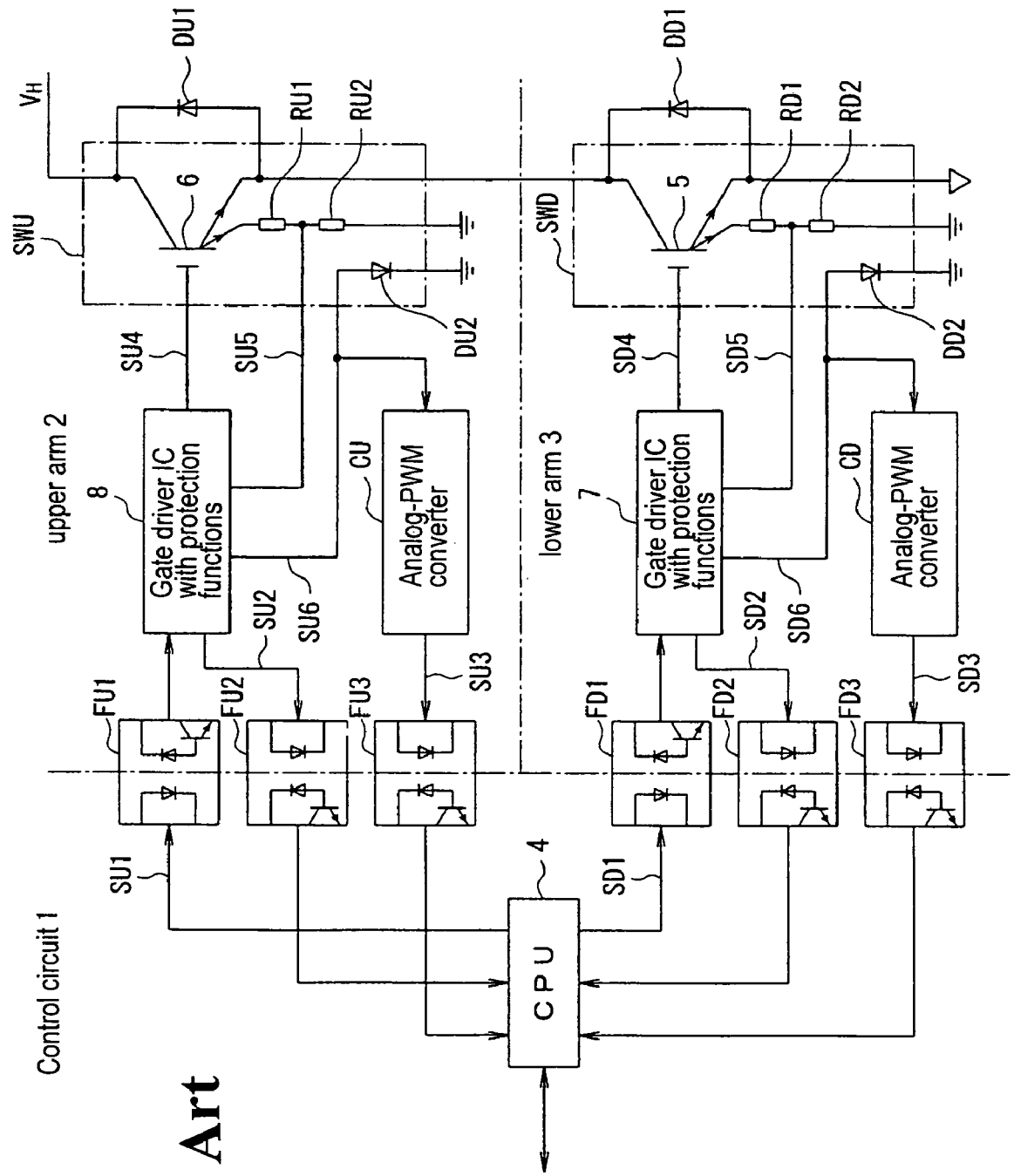
FIG. 9 is a block diagram briefly showing the configuration of an intelligent power module for a buck-boost converter of the prior art.
Figure 10:
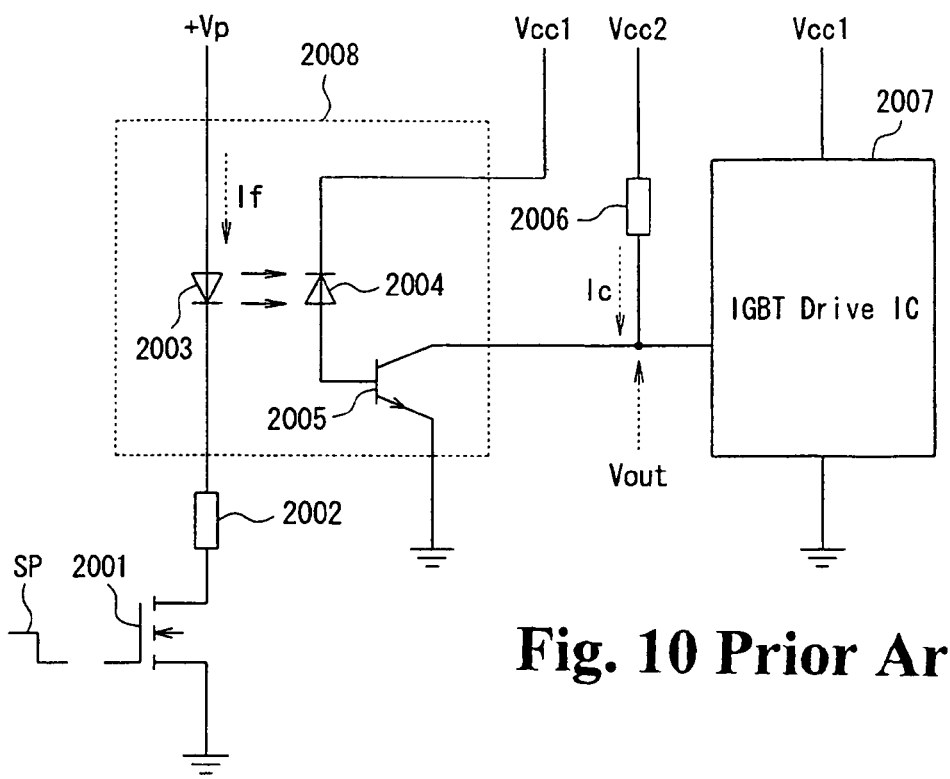
FIG. 10 is a block diagram briefly showing the configuration of photocoupler peripheral circuitry of the prior art.
Figure 11:
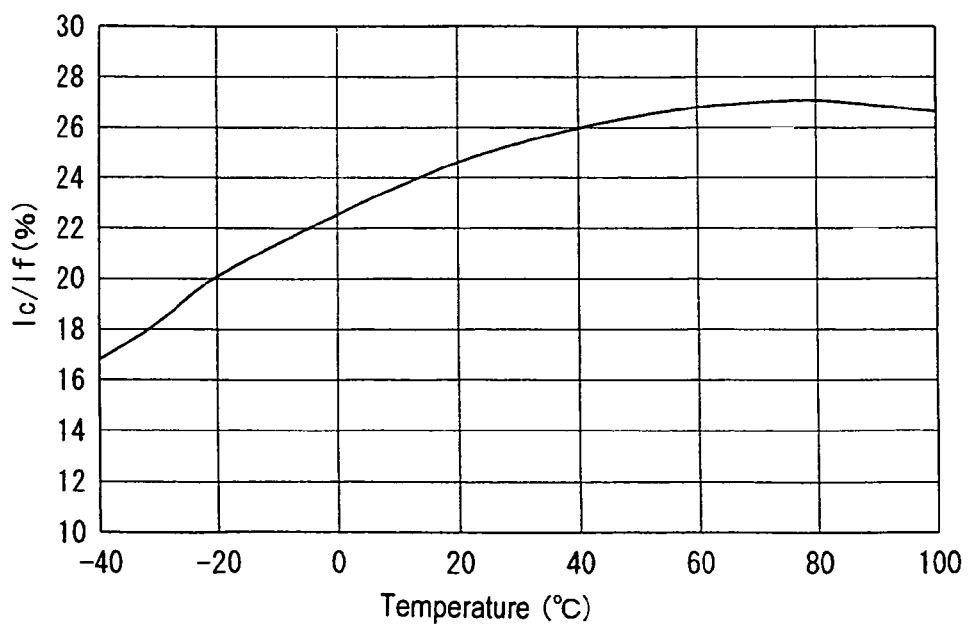
FIG. 11 shows a temperature characteristic of the current transfer ratio of the photocoupler of the prior art.
Figure 12:
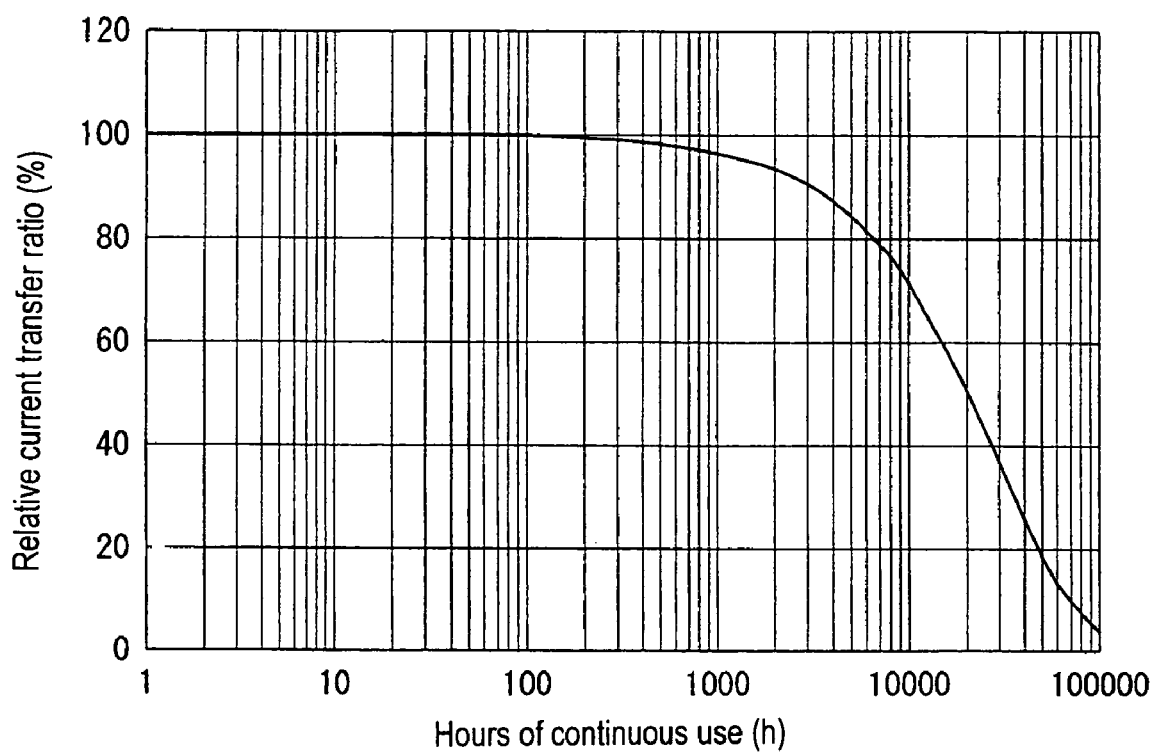
FIG. 12 shows an aging degradation characteristic of the current transfer ratio of the photocoupler of the prior art.
Figure 13:
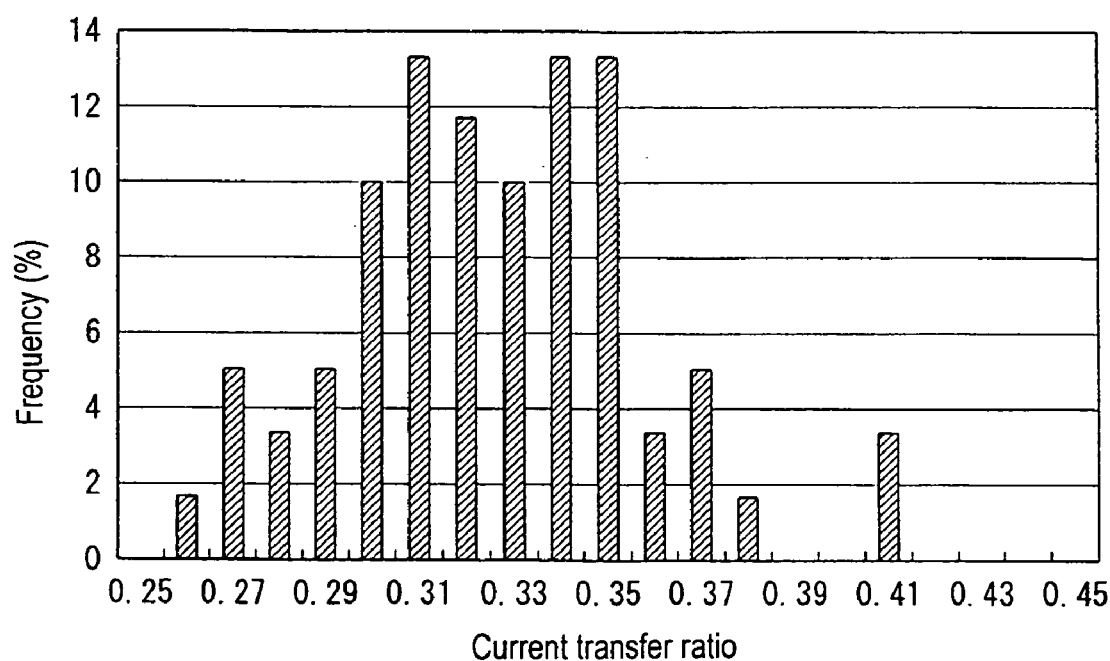
FIG. 13 shows variation in the current transfer ratio of photocouplers of the prior art.
Figure 14A:
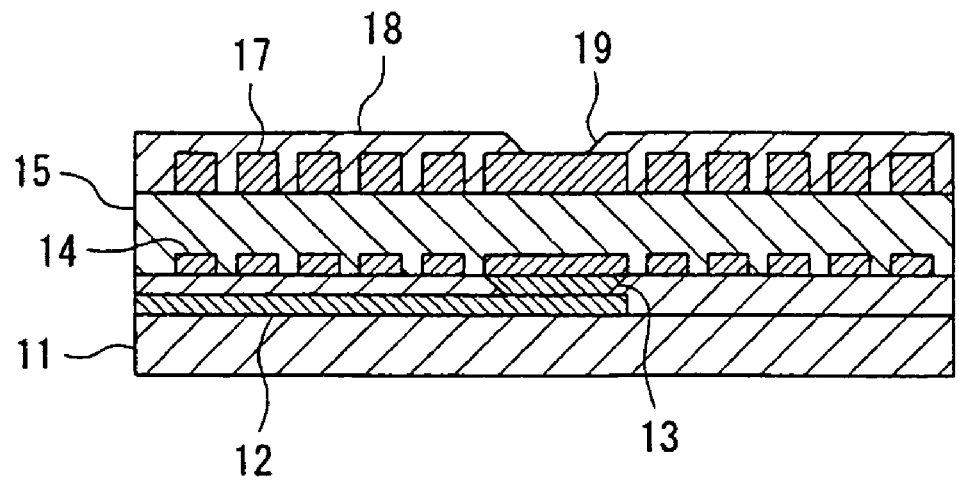
FIG. 14A is a cross-sectional view briefly showing the configuration of an insulating transformer of the prior art.
Figure 14B:
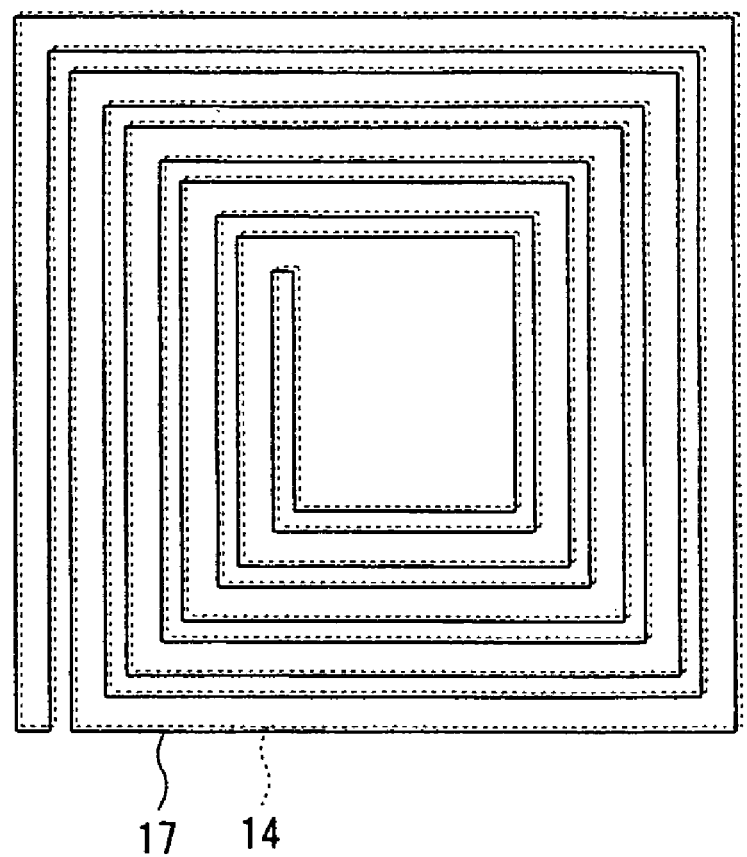
FIG. 14B is a plan view briefly showing the configuration of the insulating transformer of FIG. 14A.
Figure 15A:
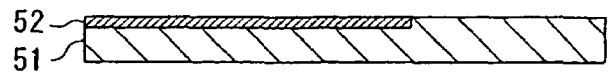
Figure 15B:
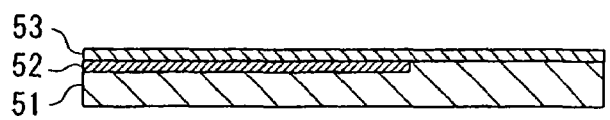
Figure 15C:
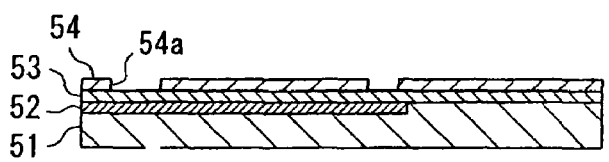
Figure 15D:
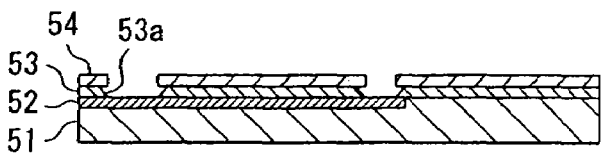
Figure 15E:
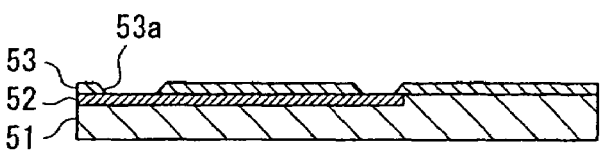
Figure 15F:
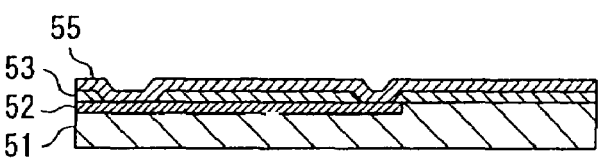
Figure 15G:
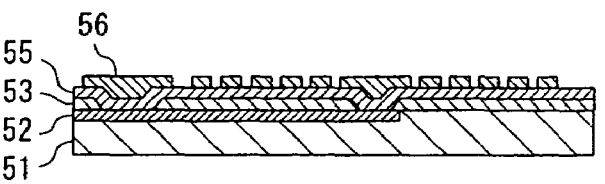
Figure 16A:
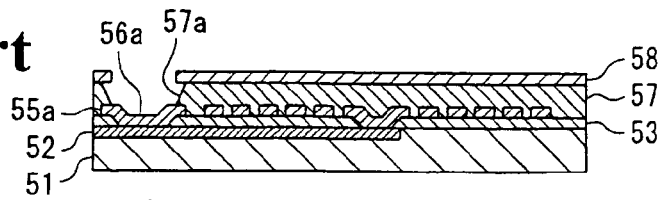
FIGS. 16A-16H are cross-sectional views showing a method of manufacture of insulating transformers of the prior art.
Figure 16B:
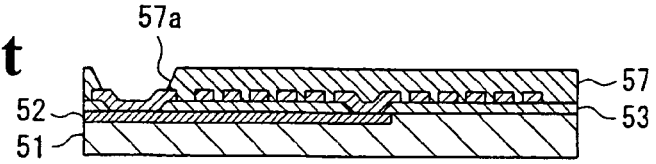
Figure 16C:
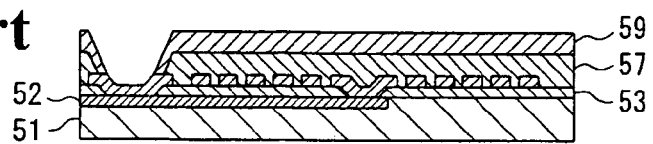
Figure 16D:
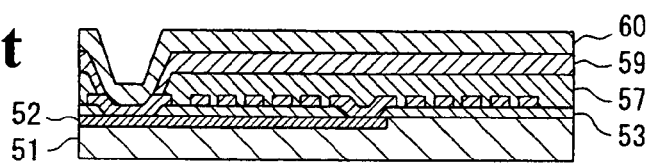
Figure 16E:
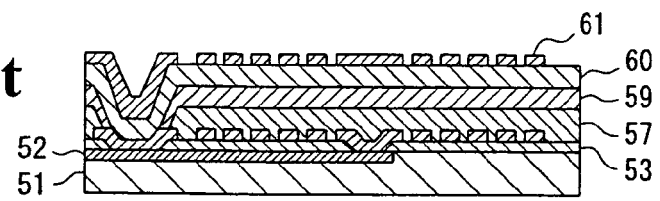
Figure 16F:
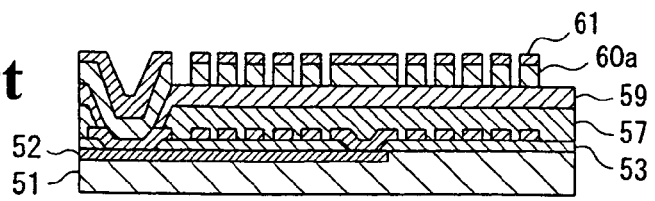
Figure 16G:
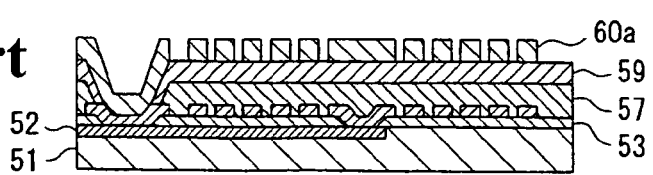
Figure 16H:
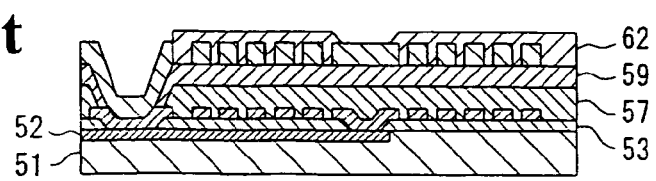

FIG. 5 is a cross-sectional view briefly showing the configuration of the primary-side coil of the insulating transformer of a second embodiment of the invention.

In FIG. 5, a primary coil pattern 213 and electrode pattern 214 are formed on a first main face of an insulating substrate 211, and the primary coil pattern 213 and electrode pattern 214 are covered by an insulating layer 216 so as to expose the connection surface of the electrode pattern 214. As the insulating substrate 211, for example, a glass plate, ceramic substrate, resin substrate, or similar can be used. Alternatively, a Si substrate or other semiconductor substrate may be used. When the material of the insulating substrate 211 does not have insulating properties, an insulating layer may be formed on the surface so as to provide the substrate with insulating properties.

On the other hand, an electrode pattern 215 for wire extraction is formed on the second main face of the insulating substrate 211 opposite to the first main face, and the electrode pattern 215 is connected to the electrode pattern 214 via a penetrating hole 212 formed in the insulating substrate 211.

Then, on the first main face of the insulating substrate 211 is formed an insulating film 219 so as to cover the connection portions of the electrode patterns 214, 215 as well as the primary coil pattern 213 and electrode pattern 214. Then, an insulating spacer layer 217 is deposited on the insulating film 219, and an adhesive layer 218 is formed on the insulating spacer layer 217.

As the materials of the primary coil pattern 213 and the electrode patterns 214 and 215, a metal such as Al or Cu can be used, and as the material of the protection film 216, silicon oxide film, silicon nitride film, or similar can be used. As the insulating spacer layer 217, an organic insulating layer in film form or sheet form can be used; for example, a polyimide film can be used. The thickness of the insulating spacer layer 217 can be set to 20 μm or greater. In order to secure an ESD tolerance voltage of 15 to 30 kV, it is preferable that the thickness of the insulating spacer layer 217 be set to 100 μm or greater. As the adhesive layer 218, an epoxy resin or other adhesive film can be used. The insulating film 219 may be, for example, formed by spin-coating a polyimide layer, or sputter deposition of a silicon oxide film.

Then, the insulating substrate 211, on which the primary coil pattern 213 is formed, is fixed onto the semiconductor substrate 101 by means of the adhesive layer 218, with the surface on which the primary coil pattern 213 is formed facing the semiconductor substrate 101 in FIG. 2A.

By this means, a voltage applied as a result of ESD is received by the two-layer structure of the insulating spacer layer 217 and the insulating film 219. Therefore, the ESD tolerance can be further enhanced.

It is preferable that the insulating substrates 111, 211 on which are respectively formed the primary coil patterns 113, 213 have higher relative permittivity than the insulating spacer layers 117, 217. For example, when a glass substrate is used for the insulating substrate 111 or 211, and polyimide film is used for the insulating spacer layers 117, 217, because the relative permittivity of glass is approximately 6 and the relative permittivity of polyimide is approximately 3 to 4, the relative permittivity of the insulating substrate 111 or 211 is higher than that of the insulating spacer layer 117 or 217.

When the relative permittivity of the insulating substrate 111 or 211 is higher than that of the insulating spacer layer 117 or 217, upon application of an ESD voltage, the electric field at the surface of the insulating spacer layer 117 or 217 is relaxed, and the voltage actually applied to the insulating spacer layer 117 or 217 can be made lower than the voltage applied due to ESD, so that the ESD tolerance can be improved.

For example, when a polyimide film (relative permittivity=3.9) of thickness 125 μm is used as the insulating spacer layer 117 in FIG. 1, as the relative permittivity of the insulating substrate 111 is increased from 6 to 8 and then to 10, the ESD tolerance voltage can be increased from 25 kV to 26 kV to 27 kV.

The disclosure of Japanese Patent Application No. 2007-210837, filed on Aug. 13, 2007, is incorporated in the application.

While the invention has been explained with reference to the specific embodiments of the invention, the explanation is illustrative and the invention is limited only by the appended claims.

What is claimed is:

1. An insulating transformer, comprising:
   a semiconductor substrate;
   an insulating substrate which overlies only a portion of the semiconductor substrate so that the semiconductor substrate extends laterally beyond the insulating substrate;
   a primary winding provided on one of the semiconductor substrate and the insulating substrate;
   a secondary winding provided on the other of the semiconductor substrate and the insulating substrate, the primary winding and the secondary winding being arranged to face each other;
   an electrode pattern disposed on a portion of the semiconductor substrate extending laterally from the insulating substrate, the electrode pattern being connected to the primary winding or the secondary winding formed on the semiconductor substrate; and
   an insulating spacer layer provided in between the semiconductor substrate and the insulating substrate for insulating and separating the primary winding and the secondary winding, the insulating spacer layer being nonperforate and free of electrical conductors passing therethrough and maintaining a constant interval between the semiconductor substrate and the insulating substrate.

2. An insulating transformer according to claim 1, further comprising:
   a penetrating hole formed exclusively in the insulating substrate; and
   an electrode formed on a face opposite to another face of the insulating substrate on which the primary winding or secondary winding is formed and which is connected to the primary winding or secondary winding via the penetrating hole so that a wire is connected to the electrode.

3. An insulating transformer according to claim 1, wherein the insulating spacer layer is an organic insulating layer in a form of a film.

4. An insulating transformer according to claim 3, wherein the organic insulating layer is a polyimide layer.

5. An insulating transformer according to claim 1, wherein the insulating substrate has a relative permittivity higher than that of the insulating spacer layer.

6. An insulating transformer according to claim 1, further comprising an insulating film formed on an under surface of the insulating spacer layer such that the primary winding or the secondary winding is covered.

7. A power conversion device, comprising:
   a pair of switching elements connected in series for operating as an upper arm and a lower arm, respectively, and conducting and blocking current flowing into a load;

a control circuit for generating control signals to direct the switching elements to become conductive or non-conductive;

a driving circuit for driving control terminals of the switching elements based on the control signals; and the insulating transformer according to claim 1.

8. A power conversion device according to claim 7, wherein the insulating layer is in a film form.

9. An insulating transformer according to claim 1, further comprising a lead wire layer formed in the semiconductor substrate and connecting the electrode pattern and the primary winding or the secondary winding formed on the semiconductor substrate.

10. An insulating transformer according to claim 9, wherein the electrode pattern is exposed on the semiconductor substrate without being covered by the insulating substrate.

11. An insulating transformer according to claim 10, further comprising an adhesive layer between the semiconductor substrate and the insulating substrate.

12. An insulating transformer according to claim 11, wherein the adhesive layer is disposed directly on a surface of the insulating spacer layer.

* * * * *

UNITED STATES PATENT AND TRADEMARK OFFICE
CERTIFICATE OF CORRECTION

| | | |
|---|---|---|
| PATENT NO. | : 7,994,890 B2 | Page 1 of 1 |
| APPLICATION NO. | : 12/219713 | |
| DATED | : August 9, 2011 | |
| INVENTOR(S) | : Masaharu Edo et al. | |

It is certified that error appears in the above-identified patent and that said Letters Patent is hereby corrected as shown below:

Please change column 16, line 33, "at 200°C. for 20 minutes" to -- at 200°C for 20 minutes --.

Signed and Sealed this
Twenty-fourth Day of July, 2012

David J. Kappos
*Director of the United States Patent and Trademark Office*